US012578781B2

(12) United States Patent
Mirichigni et al.

(10) Patent No.: US 12,578,781 B2
(45) Date of Patent: Mar. 17, 2026

(54) BANK CONFIGURABLE POWER MODES

(71) Applicant: Micron Technology, Inc., Boise, ID (US)

(72) Inventors: Graziano Mirichigni, Vimercate (IT); Andrea Martinelli, Bergamo (IT); Christophe Vincent Antoine Laurent, Agrate Brianza (IT)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 18/762,482

(22) Filed: Jul. 2, 2024

(65) Prior Publication Data

US 2024/0353914 A1     Oct. 24, 2024

Related U.S. Application Data

(63) Continuation of application No. 16/551,581, filed on Aug. 26, 2019, now Pat. No. 12,045,113.

(51) Int. Cl.
G06F 1/3287 (2019.01)
G06F 1/28 (2006.01)
(Continued)

(52) U.S. Cl.
CPC .............. G06F 1/3287 (2013.01); G06F 1/28 (2013.01); G06F 1/3275 (2013.01); G11C 11/221 (2013.01); G11C 11/2259 (2013.01); G11C 11/2273 (2013.01); G11C 11/2275 (2013.01); G11C 11/4096 (2013.01)

(58) Field of Classification Search
CPC ........ G06F 1/3287; G06F 1/28; G06F 1/3275; G11C 11/221; G11C 11/2259; G11C 11/2273; G11C 11/2275; G11C 11/4096
See application file for complete search history.

(56) References Cited

U.S. PATENT DOCUMENTS 8,503,264 B1   8/2013 Narayanan et al.
9,564,180 B1   2/2017 Pilo et al.
(Continued)

FOREIGN PATENT DOCUMENTS

CN       1723430 A       1/2006
CN     102541663 A  *  7/2012
(Continued)

*Primary Examiner* — Hyun Soo Kim
(74) *Attorney, Agent, or Firm* — Holland & Hart, LLP

(57) ABSTRACT

Methods, systems, and devices for bank-configurable power modes are described. Aspects include operating a memory device that has multiple memory banks in a first mode. While operating in the first mode, the memory device may receive a command to enter a second mode having a lower power consumption level than the first mode. The memory device may enter the second mode by switching a first subset of the memory banks to a first low power mode that operates at a first power consumption level and a second subset of the memory banks to a second low power mode that operates at a second power consumption level that may be lower than the first power consumption level. In some cases, the memory device may switch the first subset of memory banks from the first low power mode while maintaining the second subset of memory banks in the low power mode.

20 Claims, 15 Drawing Sheets

605-a  B0=1
605-b  B1=1
605-c  B2=1
605-d  B3=1
605-e  B4=0
605-f  B5=0
605-g  B6=0
605-h  B7=0

610-a  BG0=1
610-b  BG1=0
610-c  BG2=1
610-d  BG3=1

615-a
615-b

601

(51) Int. Cl.
    *G06F 1/3234*        (2019.01)
    *G11C 11/22*         (2006.01)
    *G11C 11/4096*      (2006.01)

(56)        References Cited

U.S. PATENT DOCUMENTS

| | | | |
|---|---|---|---|
| 2003/0182588 A1* | 9/2003 | Dodd | G06F 1/3225 713/323 |
| 2004/0139359 A1 | 7/2004 | Samson et al. | |
| 2005/0239518 A1 | 10/2005 | D'Agostino et al. | |
| 2008/0056051 A1 | 3/2008 | Mayer et al. | |
| 2008/0247260 A1 | 10/2008 | Song et al. | |
| 2008/0313482 A1 | 12/2008 | Karlapalem et al. | |
| 2011/0235456 A1 | 9/2011 | Jin | |
| 2012/0331220 A1 | 12/2012 | Bains | |
| 2013/0073886 A1* | 3/2013 | Zaarur | G06F 12/0223 713/320 |
| 2013/0304963 A1 | 11/2013 | Luo et al. | |
| 2014/0129757 A1 | 5/2014 | Lo et al. | |
| 2014/0195837 A1* | 7/2014 | Park | G06F 1/3287 713/323 |
| 2014/0298056 A1* | 10/2014 | Seki | G06F 1/3275 713/320 |
| 2015/0287444 A1 | 10/2015 | Lee et al. | |
| 2015/0378427 A1* | 12/2015 | Grunzke | G06F 1/3275 713/320 |
| 2016/0343416 A1 | 11/2016 | Chang et al. | |
| 2017/0206031 A1* | 7/2017 | Yin | G06F 1/3225 |
| 2017/0262042 A1 | 9/2017 | Kawasaki | |
| 2017/0352398 A1 | 12/2017 | Kawamura | |
| 2019/0043558 A1 | 2/2019 | Suh et al. | |
| 2019/0079573 A1 | 3/2019 | Hanson et al. | |
| 2019/0079574 A1 | 3/2019 | Hanson et al. | |
| 2019/0146572 A1 | 5/2019 | Nakanishi et al. | |
| 2019/0304530 A1* | 10/2019 | Choi | G06F 1/32 |
| 2020/0293105 A1 | 9/2020 | Ambardekar et al. | |

FOREIGN PATENT DOCUMENTS

| CN | 103389948 A | 11/2013 |
|---|---|---|
| CN | 104769520 A | 7/2015 |
| CN | 109155142 A | 1/2019 |

\* cited by examiner

| Register | 7 | 6 | 5 | 4 | 3 | 2 | 1 | 0 |
|----------|---|---|---|---|---|---|---|---|
| PMD[0] | B7 | B6 | B5 | B4 | B3 | B2 | B1 | B0 |
| PMD[1] | - | - | - | - | BG3 | BG2 | BG1 | BG0 |
| PMD[2] | - | - | - | - | - | - | DS_Level[1] | DS_Level[0] |

602

| Register | 7 | 6 | 5 | 4 | 3 | 2 | 1 | 0 |
|----------|---|---|---|---|---|---|---|---|
| PMD[0] | 0 | 0 | 0 | 0 | 1 | 1 | 1 | 1 |
| PMD[1] | - | - | - | - | 1 | 1 | 0 | 1 |
| PMD[2] | - | - | - | - | - | - | 0 | 1 |

603

| Register | 7 | 6 | 5 | 4 | 3 | 2 | 1 | 0 |
|---|---|---|---|---|---|---|---|---|
| PMD[0] | BG0_B7 | BG0_B6 | BG0_B5 | BG0_B4 | BG0_B3 | BG0_B2 | BG0_B1 | BG0_B0 |
| PMD[1] | BG1_B7 | BG1_B6 | BG1_B5 | BG1_B4 | BG1_B3 | BG1_B2 | BG1_B1 | BG1_B0 |
| PMD[2] | BG2_B7 | BG2_B6 | BG2_B5 | BG2_B4 | BG2_B3 | BG2_B2 | BG2_B1 | BG2_B0 |
| PMD[3] | BG3_B7 | BG3_B6 | BG3_B5 | BG3_B4 | BG3_B3 | BG3_B2 | BG3_B1 | BG3_B0 |
| PMD[4] | – | – | – | – | – | – | DS_Level[1] | DS_Level[0] |

720, 725, 730, 735, 740

702

| Register | 7 | 6 | 5 | 4 | 3 | 2 | 1 | 0 |
|---|---|---|---|---|---|---|---|---|
| PMD[0] | 0 | 1 | 0 | 0 | 1 | 1 | 1 | 1 |
| PMD[1] | 0 | 1 | 0 | 1 | 0 | 0 | 1 | 0 |
| PMD[2] | 0 | 1 | 0 | 0 | 1 | 1 | 0 | 1 |
| PMD[3] | 0 | 1 | 0 | 0 | 1 | 1 | 0 | 1 |
| PMD[4] | – | – | – | – | – | – | 0 | 1 |

720, 725, 730, 735, 740

703

| Register | 7 | 6 | 5 | 4 | 3 | 2 | 1 | 0 |
|---|---|---|---|---|---|---|---|---|
| PMD[0] | BG0_B3_1 | BG0_B3_0 | BG0_B2_1 | BG0_B2_0 | BG0_B1_1 | BG0_B1_0 | BG0_B0_1 | BG0_B0_0 |
| PMD[1] | BG0_B7_1 | BG0_B7_0 | BG0_B6_1 | BG0_B6_0 | BG0_B5_1 | BG0_B5_0 | BG0_B4_1 | BG0_B4_0 |
| PMD[2] | BG1_B3_1 | BG1_B3_0 | BG1_B2_1 | BG1_B2_0 | BG1_B1_1 | BG1_B1_0 | BG1_B0_1 | BG1_B0_0 |
| PMD[3] | BG1_B7_1 | BG1_B7_0 | BG1_B6_1 | BG1_B6_0 | BG1_B5_1 | BG1_B5_0 | BG1_B4_1 | BG1_B4_0 |
| PMD[4] | BG2_B3_1 | BG2_B3_0 | BG2_B2_1 | BG2_B2_0 | BG2_B1_1 | BG2_B1_0 | BG2_B0_1 | BG2_B0_0 |
| PMD[5] | BG2_B7_1 | BG2_B7_0 | BG2_B6_1 | BG2_B6_0 | BG2_B5_1 | BG2_B5_0 | BG2_B4_1 | BG2_B4_0 |
| PMD[6] | BG3_B3_1 | BG3_B3_0 | BG3_B2_1 | BG3_B2_0 | BG3_B1_1 | BG3_B1_0 | BG3_B0_1 | BG3_B0_0 |
| PMD[7] | BG3_B7_1 | BG3_B7_0 | BG3_B6_1 | BG3_B6_0 | BG3_B5_1 | BG3_B5_0 | BG3_B4_1 | BG3_B4_0 |

— 802

| Register | 7 | 6 | 5 | 4 | 3 | 2 | 1 | 0 |
|---|---|---|---|---|---|---|---|---|
| PMD[0] | 0 | 0 | 0 | 0 | 0 | 0 | 0 | 0 |
| PMD[1] | 1 | 1 | 0 | 0 | 0 | 1 | 1 | 0 |
| PMD[2] | 1 | 1 | 1 | 0 | 0 | 0 | 0 | 1 |
| PMD[3] | 1 | 1 | 0 | 0 | 0 | 1 | 0 | 0 |
| PMD[4] | 0 | 0 | 0 | 0 | 0 | 1 | 0 | 0 |
| PMD[5] | 1 | 0 | 0 | 0 | 0 | 1 | 1 | 0 |
| PMD[6] | 0 | 0 | 0 | 0 | 1 | 0 | 0 | 0 |
| PMD[7] | 1 | 0 | 0 | 0 | 0 | 1 | 1 | 0 |

— 803

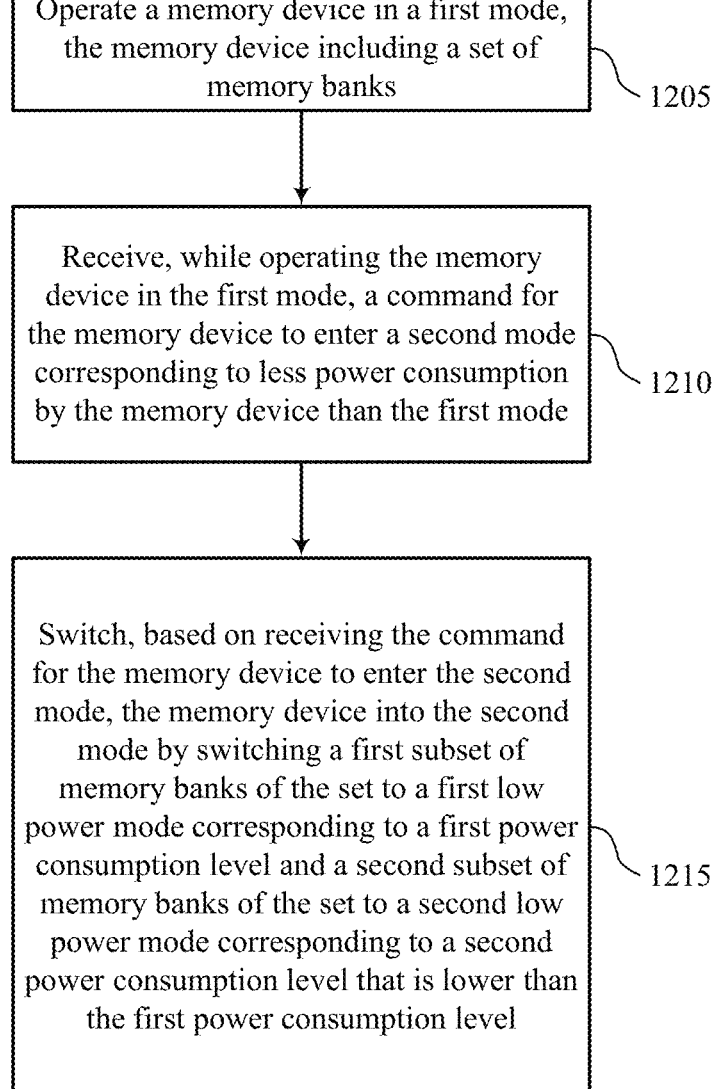

Operate a memory device in a first mode, the memory device including a set of memory banks

1205

Receive, while operating the memory device in the first mode, a command for the memory device to enter a second mode corresponding to less power consumption by the memory device than the first mode

1210

Switch, based on receiving the command for the memory device to enter the second mode, the memory device into the second mode by switching a first subset of memory banks of the set to a first low power mode corresponding to a first power consumption level and a second subset of memory banks of the set to a second low power mode corresponding to a second power consumption level that is lower than the first power consumption level

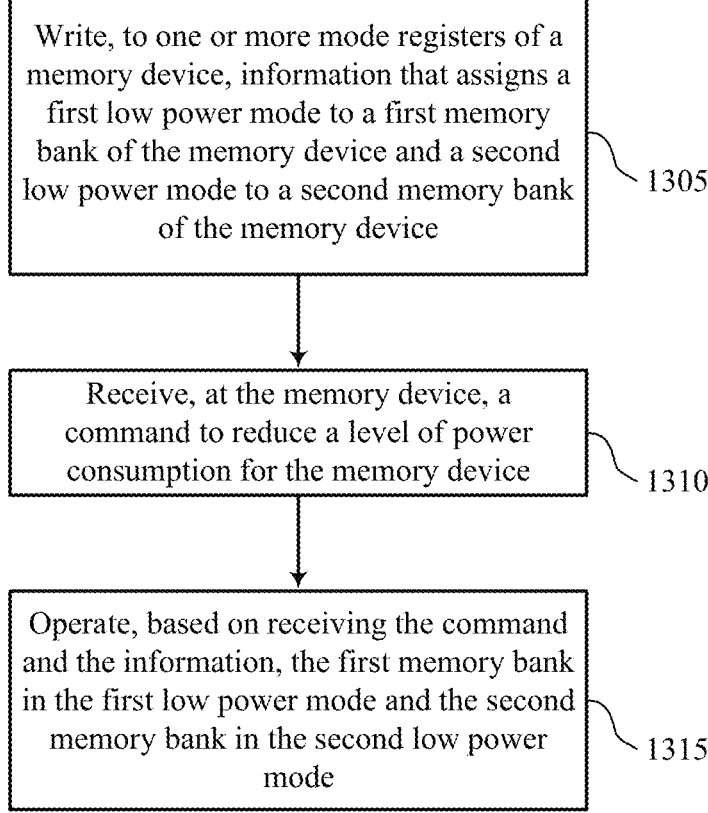

Write, to one or more mode registers of a memory device, information that assigns a first low power mode to a first memory bank of the memory device and a second low power mode to a second memory bank of the memory device

1305

Receive, at the memory device, a command to reduce a level of power consumption for the memory device

1310

Operate, based on receiving the command and the information, the first memory bank in the first low power mode and the second memory bank in the second low power mode

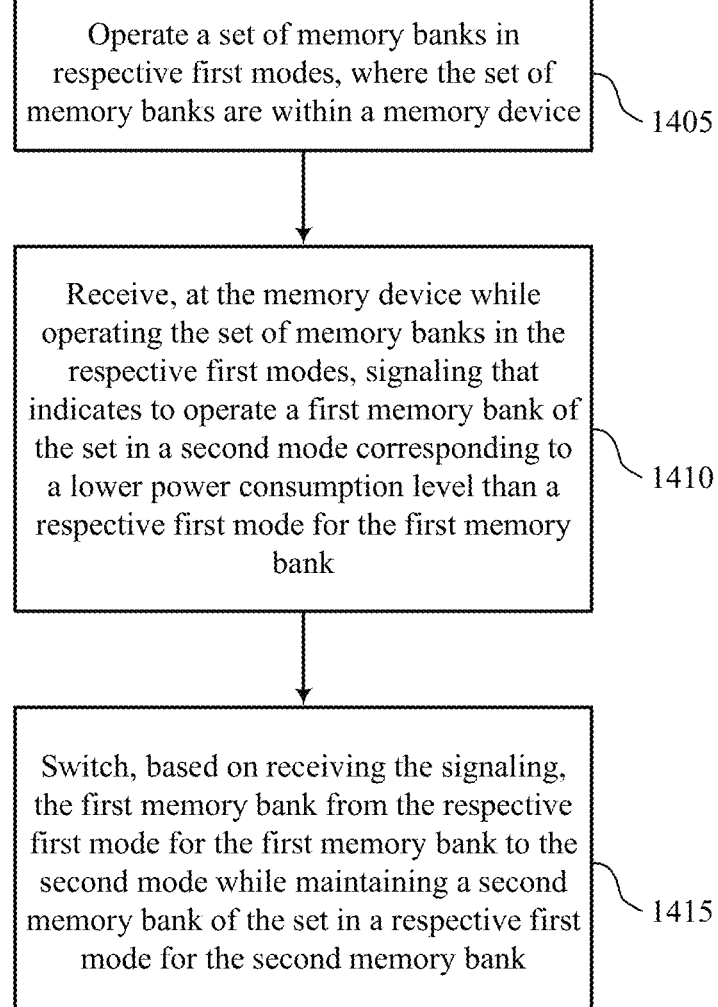

Operate a set of memory banks in respective first modes, where the set of memory banks are within a memory device

1405

Receive, at the memory device while operating the set of memory banks in the respective first modes, signaling that indicates to operate a first memory bank of the set in a second mode corresponding to a lower power consumption level than a respective first mode for the first memory bank

1410

Switch, based on receiving the signaling, the first memory bank from the respective first mode for the first memory bank to the second mode while maintaining a second memory bank of the set in a respective first mode for the second memory bank

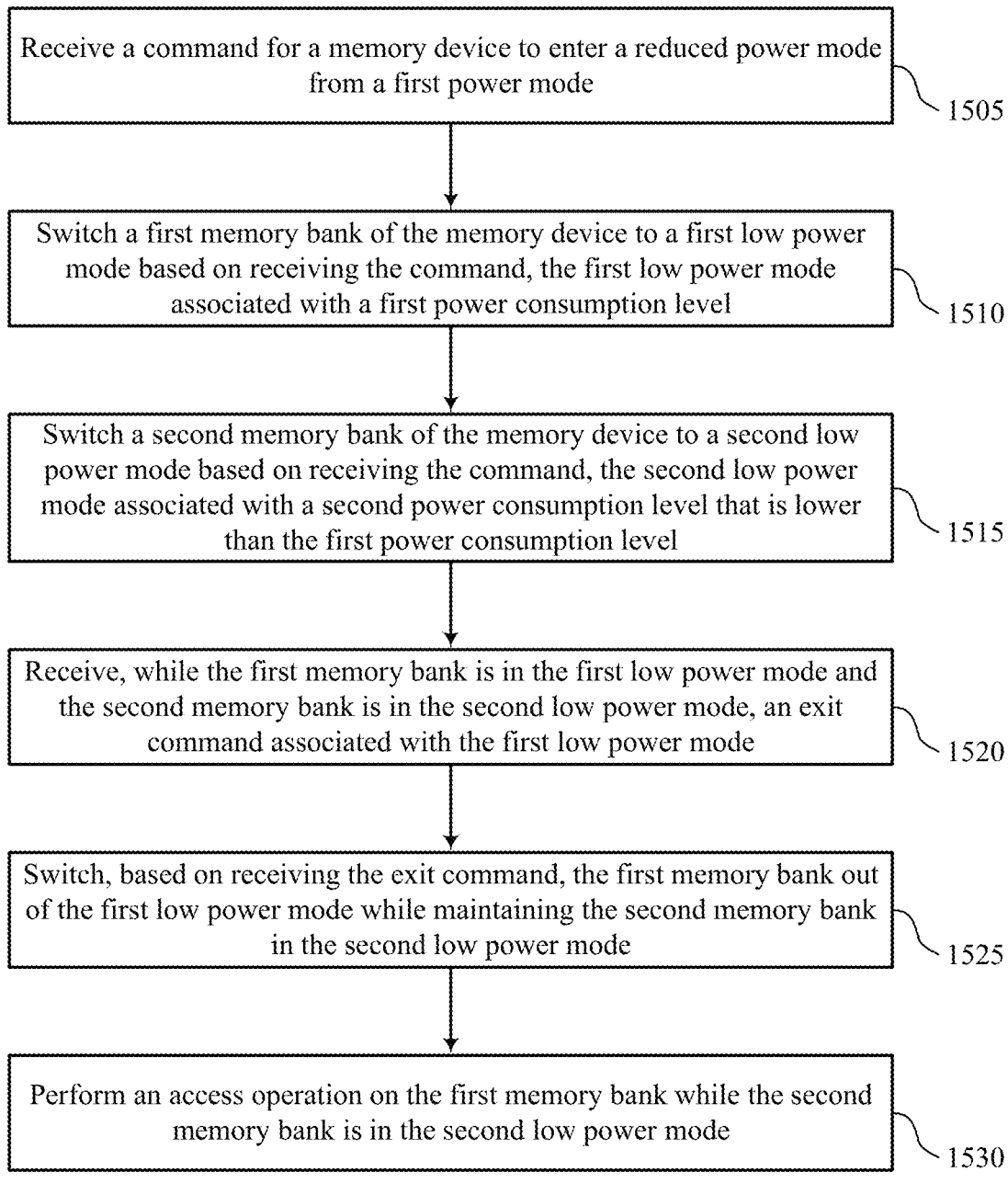

Receive a command for a memory device to enter a reduced power mode from a first power mode

1505

Switch a first memory bank of the memory device to a first low power mode based on receiving the command, the first low power mode associated with a first power consumption level

1510

Switch a second memory bank of the memory device to a second low power mode based on receiving the command, the second low power mode associated with a second power consumption level that is lower than the first power consumption level

1515

Receive, while the first memory bank is in the first low power mode and the second memory bank is in the second low power mode, an exit command associated with the first low power mode

1520

Switch, based on receiving the exit command, the first memory bank out of the first low power mode while maintaining the second memory bank in the second low power mode

1525

Perform an access operation on the first memory bank while the second memory bank is in the second low power mode

BANK CONFIGURABLE POWER MODES

CROSS REFERENCE

The present Application for Patent is a continuation of U.S. patent application Ser. No. 16/551,581 by Mirichigni et al., entitled "BANK CONFIGURABLE POWER MODES," filed Aug. 26, 2019, which is assigned to the assignee hereof and is expressly incorporated by reference herein.

BACKGROUND

The following relates generally to a system that includes at least one memory device and more specifically to bank-configurable power modes.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increase read/write speeds, increasing reliability, increasing data retention, reducing power consumption, or improving manufacturing processes, among other metrics. Solutions for improving power consumption at a memory device may be desired.

BRIEF DESCRIPTION OF THE DRAWINGS

FIGS. 12 through 15 show flowcharts illustrating a method or methods that support bank-configurable power modes in accordance with examples as disclosed herein.

DETAILED DESCRIPTION

Figure 1:
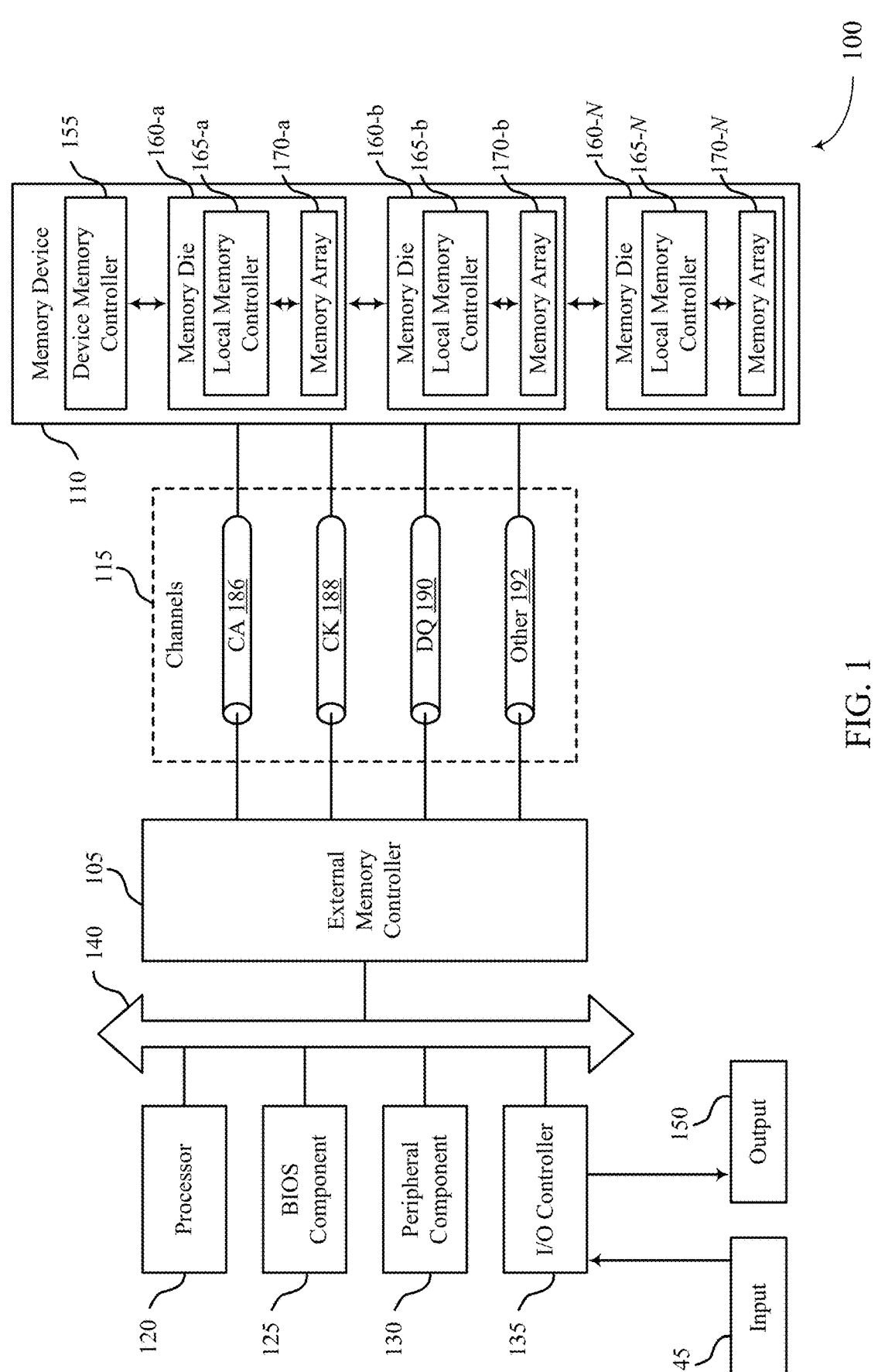
FIG. 1 illustrates an example of a system that supports bank-configurable power modes in accordance with examples as disclosed herein.

Some memory devices may operate in one or more low power modes where the memory device may disable or change operation of circuitry supporting the memory cells to reduce power consumption. For example, a FeRAM device may transition from an idle state to a low power state that has lower power consumption than the idle state based on deactivating some amount of circuitry. In the low power state, the memory device may not be able to perform access operations (e.g., read operations, write operations, etc.) on memory cells of the memory device or able to transition directly to an active state in which such operations may be performed (e.g., when in the lower power state, the memory device may have to first transition to the idle state, then to the active state). In some cases, a FeRAM device may support different low power states associated with different decreased levels of current consumption (e.g., associated with different amounts of deactivated circuitry).

Similarly, a DRAM device may also transition its memory banks from an idle state to a low power state, which may include powering down one or more circuitry components to decrease the current consumption at the DRAM device. In some cases, a DRAM may maintain a self-refresh mode while powering down other components that are used to perform access operations (e.g., read operations, write operations, etc.).

Transitioning a memory device from a low power mode to an active mode (e.g., to an idle mode and then to an active mode) may take a period of time. For example, the memory device may need to perform one or more procedures to activate circuitry that was deactivated while in the low power state in order to access memory cells. In some cases, low power modes having lower current consumption (i.e., using less energy, having more circuitry deactivated) may take longer to transition to an idle or active mode.

Some memory devices (e.g., some FeRAM and DRAM devices) may control low power modes at a device or die level. That is, when entering a low power mode, circuitry for the entire device or die may change operating modes to use less power. Accordingly, if a memory device receives a command to perform an operation at the memory array, there may be a latency associated with transitioning the memory device or die from a low power mode to an idle mode and then transitioning at least a portion of the memory array (e.g., a bank of the memory array) to an active mode. Further, although the entire memory device may switch in or out of a low power mode, the access operations (e.g., read, write, etc.) may only be performed on the active portion of the memory array. As a result, the memory die may only switch to a low power mode if it will stay in that low power mode for a minimum duration, such as a long enough duration to achieve an overall reduction in power consumption (e.g., the reduced power use from operating in the low power mode is greater than power loss associated with transitioning the die into and out of the low power mode). Accordingly, a memory die may achieve less power savings than desired due to losses associated with switching the entire device or die into and out of a lower power mode. Further, a memory device or die may operate in a low power mode less frequently due to the latency required to wake up the entire device or die, further increasing power consumption.

A memory device may achieve greater power savings (e.g., less current consumption) by operating different portions of the memory device or a die therein (e.g., different portions of a single memory array) in different power modes. For example, a first portion of the memory device or die may be operated in a first power mode and a second portion of the memory device or die may be operated in a second power mode. The first power mode could be an active mode or a low power mode that can be accessed with a shorter latency (e.g., a quicker wake up time) than other low power modes. Such a low power mode with a relatively shorter latency may be referred to as a power down (PD) mode. The memory device may operate the second portion of the memory in a second low power mode as compared to the PD mode, where the second low power mode may be accessed with a longer latency. The low power mode with a relatively longer latency may be referred to as a deep sleep (DS) mode. In some case, a memory device may support multiple DS modes, which may respectively correspond to different amounts of power consumption (e.g., different amounts of deactivated circuitry for a portion of the memory device in the DS mode), and different portions of the memory device may concurrently be in different DS modes. In some cases, the memory device may switch the first portion of the memory from the PD mode to an idle or active mode while maintaining the second portion of memory in the DS mode (or vice versa). In this regard, the memory device may achieve increased power saving by operating different portions of the device in different power modes and in some cases only transitioning a portion of the memory cells to an active mode to perform access operations. Accordingly, the memory device may reduce losses from transitioning into and out of low power modes and operate in one or more low power modes more often and for a greater amount of time.

Aspects of the teachings herein include using a power mode bitmap to indicate the portions (e.g., memory banks) that are to be operated in various low power modes (e.g., PD and DS power modes). The power mode bitmap may be written to one or more registers (e.g., mode registers) or other storage within the memory device. Additionally or alternatively, the memory device may be configured via one or more commands for switching different portions (e.g., different memory banks) to one or more low power modes. In some cases, when the memory device receives a command to enter a low power mode, the memory device may access the power mode bitmap to determine which portions of the memory device should be operated in which low power mode. Further, while operating in one or more low power modes, the memory device may switch one or more portions from a low power mode to an active or idle mode, while maintaining other portions of the memory device in the low power mode. In some cases, the memory device may control low power modes at the bank level. Accordingly, the memory device may switch different banks between an active mode, an idle mode and one or more different low power modes.

Operation of the different portions of the memory device in different low power modes may result in an overall decreased current consumption. For example, the memory device may be able to operate some portions of the memory in a low power mode such as a DS mode more often and for longer periods of time as compared to a memory device which switches the entire memory device into and out of a low power mode. Further, the memory device may decrease latency operating a portion of the memory device in a PD mode that it can more quickly switching to an idle or active mode to address command received by the memory device.

In some cases, a memory device may benefit from operating some memory banks in a PD mode and other memory banks in one or more DS modes, including when the same or a limited number of banks are repeatedly accessed. For example, these frequently accessed banks may be operated in a PD mode, which may support more quickly switching them to idle/active modes for performing one or more access operations. Accordingly, these banks may achieve slightly increased power savings by switching between the PD mode and idle/active modes. Further, the memory device may achieve greater decreases in power use by operating other memory banks in one or more DS modes and may not need to switch theses DS banks into an idle/active mode because access operations are concentrated at the PD banks. Accordingly, the overall current use (e.g., due to both PD and DS modes) for a memory device may decrease as compared to systems that switch the entire memory device or die between active and low power modes. In some cases, operating additional memory banks in DS modes to increase power savings may decrease bandwidth for access operations due to the greater access times associated with portions of the memory device operating in the DS mode. The quantity of memory banks operating in each of the PD and DS modes may be varied to balance power savings and bandwidth. Further, in some cases a memory controller (internal or external to the memory device) may allocate data for one or more applications across one or more memory banks based on power consumption considerations (e.g., by concentrating associated data within a relatively small number of memory banks, to support increased use of DS modes for other memory banks). These and other benefits may be appreciated by one of ordinary skill in the art.

Features of the disclosure are initially described in the context of a memory system and memory die as described with reference to FIGS. 1-2. Features of the disclosure are described in the context memory device state diagrams, process flows, power mode bitmaps, and power level consumption diagrams as described with reference to FIGS. 3-10. These and other features of the disclosure are further illustrated by and described with reference to an apparatus diagram and flowcharts that relate to bank-configurable power modes as described with references to FIGS. 11-15.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes.

In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

The memory device 110 may receive one or more commands to operate one or more portions of the memory device 110 in a low power mode. For example, the memory device 110 may receive a command to write power bitmap data (e.g., via a CA channel 186) to one or more mode registers of the memory device 110. The power bitmap data may indicate a first portion of the memory device 110 (e.g., one or more memory banks) to be operated in a first low power mode such as a PD mode. The power bitmap data may also indicate a second portion of the memory device 110 to be operated in a second low power mode that is associated with a lower power consumption level than the first mode such as a DS mode. The memory device 110 may receive the power bitmap data and write it to one or more mode registers.

The memory device 110 receive a command to enter a low power mode and access the power bitmap data stored on the mode registers. Additionally or alternatively, the memory device 110 may receive one or more commands specifying information that may be otherwise written to mode registers. The memory device 110 may switch the first portion of the memory device 110 to the PD mode and switch the second portion of the memory device 110 to the DS mode. While operating in the first and second portions in their respective low power modes, the memory device 110 may receive a command to switch the first portion from the PD mode, for example, to an idle or active mode (e.g., the memory device 110 may receive a command to selectively switch only portions in the PD mode to an idle or active mode, leaving portions in a DS mode in the DS mode). The memory device 110 may cause the first portion of the memory device 110 to exit from the PD mode while continuing to operate the second portion in the DS mode. The memory device 110 may perform one or more operations at the first portion of the memory device 110. For example, the memory device 110 may perform read or write operations on banks associated with the first portion of the memory device 110. In some cases, the memory device 110 may receive a command to switch the first portion back to the low power mode and cause the first portion to enter the PD mode.

Figure 2:
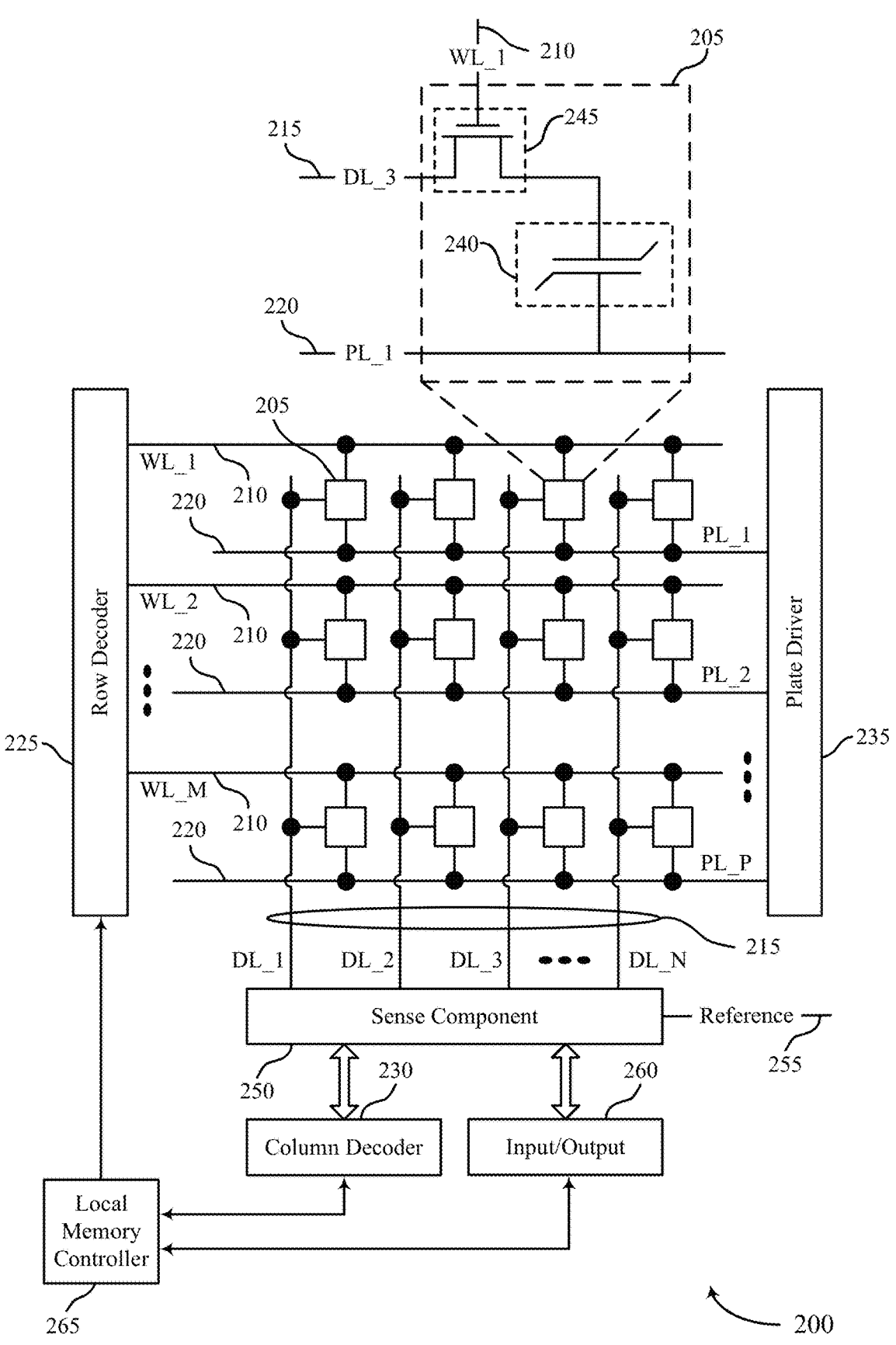
FIG. 2 illustrates an example of a memory die that supports bank-configurable power modes in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
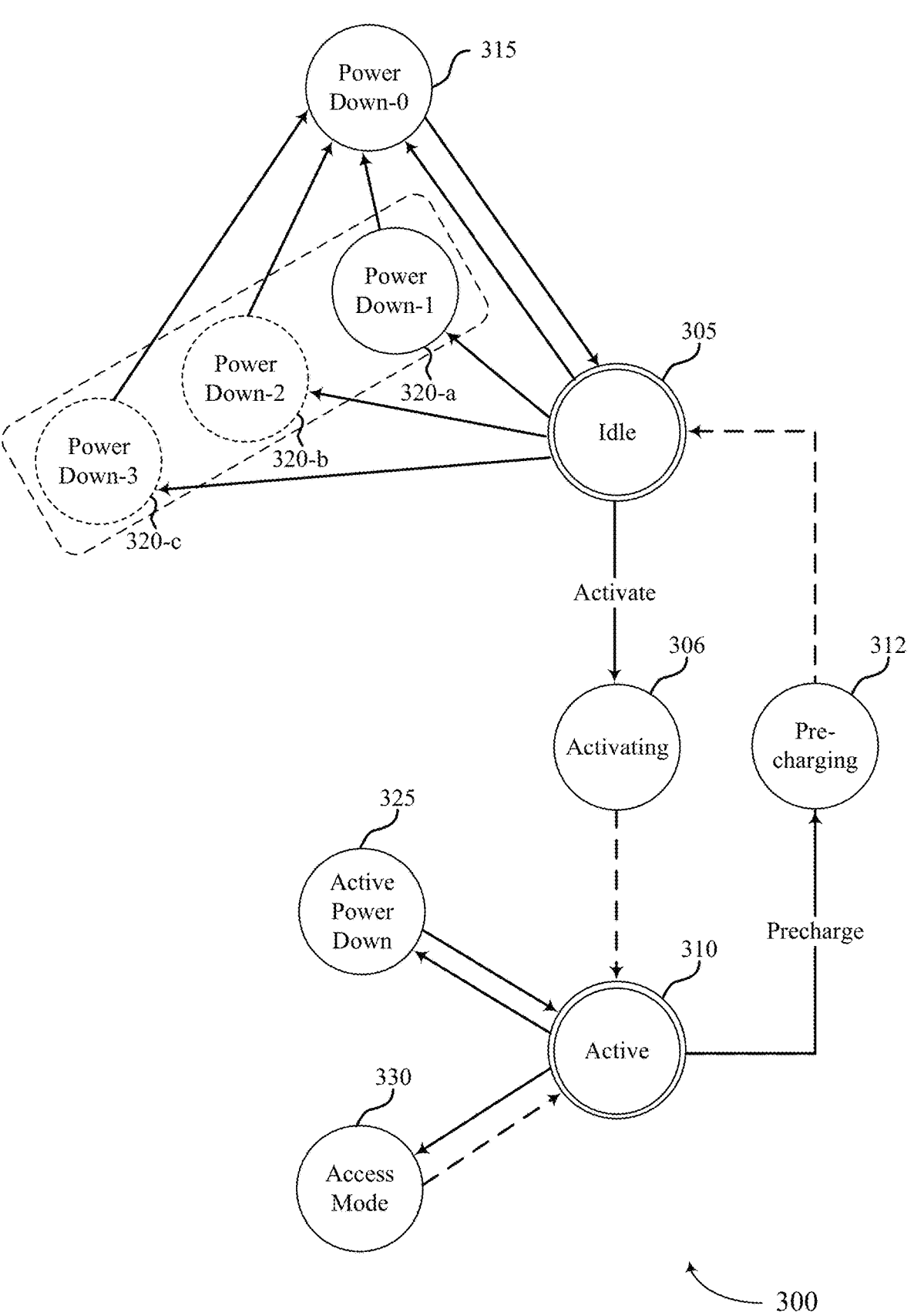
FIG. 3 illustrates an example of a memory device state diagram that supports bank-configurable power modes in accordance with examples as disclosed herein.

FIG. 3 illustrates an example of a memory device state diagram 300 that supports bank-configurable power modes in accordance with examples as disclosed herein. The features of the memory device state diagram 300 may be performed by a memory device (e.g., the memory device 110, the memory dice 160 or the memory die 200 described with reference to FIGS. 1-2) or one or more components of a memory device such as the memory device controller 155, the local memory controllers 165 or the local memory controller 265 described with reference to FIGS. 1-2. The memory device state diagram 300 may illustrate different states or operating modes that one or more portions (e.g., one or more banks) of the memory device may transition between. In some cases, certain functions of the memory device (e.g., read operations, write operations, refresh operations, etc.) may only be executed when a relevant portion (e.g., bank) of the memory device is operating in a specific state or mode (e.g., an active mode).

Among other states, a memory device (e.g., at the direction of one or more controllers for the memory device, such as an external memory controller 105, a device memory controller 155, or a local memory controller 165, or a combination thereof) may operate in an idle state 305 or an active state 310. In the idle state 305, no memory cells may be available for access. In the active state 310, at least one portion (e.g., one bank, one row within one bank) of the memory device may be activated and available for access operations (e.g., read operations, write operations, or refresh operations). The memory device may switch between the idle mode 305 and the active mode 310 based on receiving one or more commands. For example, a memory device may be operating in the idle mode 305 and switch to the active mode 310 based on receiving a command (e.g., an Activate command for a memory bank) from a host device. The Activate command may transition the device into an activating mode 306, which may power up one or more components of the memory device. Once components of the memory device have powered up, the memory device may automatically transition from the activating mode 306 to the active mode 310. In some cases, a memory device may be operating in the active mode 310 and switch to the idle mode 305. For example, the memory device, while operating in the active mode 310, may receive a command to switch to an idle mode and perform one or more procedures to transition to the idle mode 305. In some cases (e.g., DRAM memory devices), a memory device may receive a precharge command and transition to a precharging mode 312. From the precharging mode 312 the memory device may automatically transition to the idle mode 305, for example, after completing one or more precharging operations. The memory device may switch from the idle state 305 to any of a first set of operating modes, and from the active state 310 to any of a second set of modes.

In some cases, from the idle mode 305, a controller may switch the memory device to operate in one of multiple low power modes 315, 320. For example, a memory device may enter a first low power mode 315 (e.g., Power Down-0), which may be referred to as a power down (PD) mode. When operating in the PD mode 315, a memory device may consume less current than when operating in the idle mode 305 or the active mode 310. In some examples, the PD mode 315 may be associated with the highest amount of current consumption out of the low power modes 315, 320 and have the shortest exit time back to the idle mode 305. In other examples, a memory device may enter a second set of low power modes 320 (e.g., Power Down-1, Power Down-2, Power Down-3), which may be referred to as a deep sleep (DS) mode 320. When operating in the DS mode 320, a memory device may consume less current (and deactivate more components) than when operating in the PD mode 315. A first DS mode 320-a may have the highest current consumption of the DS modes 320 and be referred to as a first DS level. A second DS mode 320-b may have a lower current consumption (and deactivate more components) than the first DS mode 320-a and be referred to as a second DS level. A third DS mode 320-c may have the lowest current consumption (and the most deactivated components) of the DS modes 320 and be referred to as a third DS level. In some examples, the first DS mode 320-a may have a slower exit time (e.g., time to switch to the idle state 305 or active state 310) than the PD mode 315, but the fastest exit time of the DS modes 320. The second DS mode 320-b may have a slower exit time than the first DS mode 320-a and a faster exit time than the third DS mode 320-c. It is to be understood that any number of PD or DS modes is possible.

In some examples, when a memory device is exiting a DS mode 320, the device may first transition to a different low power mode such as the PD mode 315 or a refresh mode before switching to the idle mode 305. For example, when a memory device is operating in the first DS mode 320-a and receives a command to exit the low power mode, the memory device may first switch to the PD mode 315 before switching to the idle mode 305. In examples including a DRAM memory device, the PD mode 315 may include performing self-refresh operations before switching to the idle mode 305. In some examples, when a memory device is exiting a DS mode 320 or a PD mode 315, it may transition directly to an idle mode, an active mode, or a different low power mode (e.g., from one DS mode 320 to another DS mode 320, from one PD mode 315 to another PD mode 315, from DS mode 320 to a PD mode 315, or from a PD mode 315 to a DS mode 320).

In some cases, from the active mode 310, a controller may switch a memory device to operate in the active power down mode 325 or the access mode 330. In the active power down mode 325, current consumption may be higher than in low power modes 315, 320. For example, at least some circuitry within the memory device that is deactivated while the memory device is in one of the low power modes 315, 320 may remain active while the memory device is in the active power down mode 325. When the memory bank is in the access mode 330, a memory device may perform one or more access operations (e.g., read, write, etc.) on memory cells of an activated portion of the memory device (e.g., an activated memory bank).

In some cases, as described herein, different portions of a memory device may be operated in different modes. For example, a memory device may be operating in a first mode such as an idle mode 305. A controller may switch a first portion of the memory device to operate in a first low power mode such as the PD mode 315 and a second portion of the memory device to operate in a second low power mode such as the DS mode 320. In some cases, the controller may subsequently switch the first portion from the PD mode 315 to the idle mode 305 or active mode 310 while maintaining the second portion in the DS mode. The controller may also subsequently switch the first portion from the idle 305 or active mode 310 back to a low power mode, such as the PD mode 315 while maintaining the second portion in the DS mode.

In some cases, a controller may switch operating modes of the memory device at a bank level. For example, one or more banks of the memory device may be independently switched between different operating modes. In some examples, a first bank or set of banks may be switched (e.g., from an idle mode 305) to operate in the PD mode 315, while a second bank or set of banks are switched (e.g., from the idle mode 305) to operate in the DS mode 320. In other examples, additional sets of banks may be independently operated in other or the same modes. For example, a first set of banks may be switched to the PD mode 315 and a second set of banks may also be switched to the PD mode 315. In some cases, the first set of banks may be switched out of the PD mode 315 while maintaining the second set of banks in the PD mode 315 (or in a DS mode 320). In further examples, a third set of banks may be operated in a different mode, such the DS mode 320. Accordingly, a memory device may dynamically and independently switch different banks or bank groups between different operating modes. It is to be understood that concepts may in some cases be described with references to one or more memory banks as an example and for clarity, but that a memory device may switch other portions of a memory device or die between different operating modes in a similar manner as described herein for memory banks.

Figure 4A:
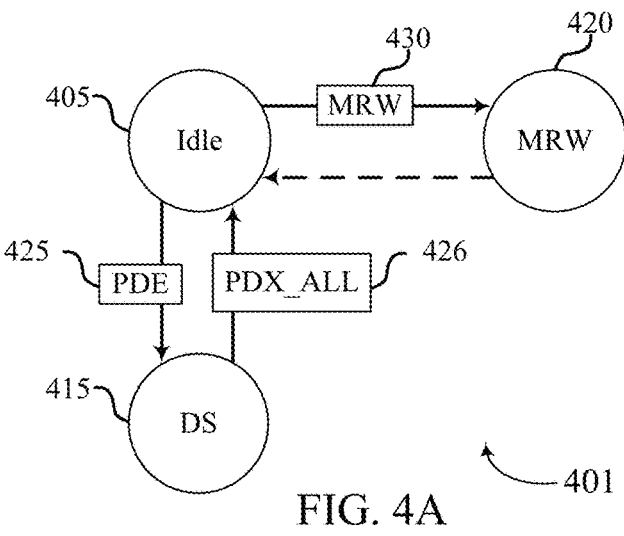
FIGS. 4A-C illustrate examples of command mode state diagrams that supports bank-configurable power modes in accordance with examples as disclosed herein.

FIG. 4A illustrates an example of a command mode state diagram 401 that supports bank-configurable power modes in accordance with examples as disclosed herein. The features of the command mode state diagram 401 may be performed by a memory device (e.g., the memory device 110, the memory dice 160 or the memory die 200 described with reference to FIGS. 1-2) or one or more components of a memory device such as the memory device controller 155, the local memory controllers 165 or the local memory controller 265 described with reference to FIGS. 1-2. The command mode state diagram 400 may illustrate one or more commands 425, 426 used to switch a memory device between an idle mode 405, which may be an example of the idle mode 305 described with reference to FIG. 3, and a low power mode 415, which may be an example of the low power modes 320 (e.g., DS modes) described with reference to FIG. 3. In some cases, a mode register write (MRW) command 430 may be used to write data to one or more mode registers of a memory device.

A memory device may be configured via one or more commands for switching different portions of the memory device between different modes. In some examples, data indicating an assignment of different portions of the memory device (e.g., memory banks) to different low power modes may be stored in a mode register. A mode register write (MRW) command 430 may be used to switch a memory device into a MRW mode 420. For example, a memory device may be operating in the idle mode 405 and receive the MRW command 430. In response, the memory device may switch from the idle mode 405 to the MRW mode 420, and while in the MRW mode 420, the memory device may write data to the mode register indicating an assignment of different memory banks to different low power modes. Upon completion of writing the mode register data, the memory device may switch from the MRW mode 420 back to the idle mode 405. In some examples, the switch from the MRW mode 420 to the idle mode may be automatic (e.g., upon completion of writing the mode register data).

A power down enter (PDE) command may be used to switch a memory device into the low power mode 415. For example, a memory device may be operating in the idle mode 405 and receive the PDE command 425-*a*. In response, the memory device may switch from the idle mode 405 to the low power mode 415 (e.g., DS mode), which may include different portions of the memory device entering different low power modes (e.g., a first set of banks entering a first DS level and a second set of banks entering a second DS level). In some cases, the assignment of a first portion of the memory device to a first low power mode 415 (e.g., a first DS level) and a second portion of the memory device to a second low power mode 415 (e.g., a second DS level) may be based data stored at the mode register. Different portions of the memory device may be operated in their respective low power modes until receiving one or more power down exit (PDX) commands.

In some cases, the memory device may receive an exit command 426 (e.g., PDX_ALL) to switch all memory banks out of the low power mode 415. For example, the exit all command 426 may be configured to indicate that all memory banks operating in the low power mode 415 (e.g., DS mode) are to be switched to the idle mode 405. The memory banks operating in the DS mode may switch to the idle mode 405 in the DS exit time, which may be greater than the PD exit time. In some cases, an exit time may alternatively be referred to as a wakeup time.

Figure 4B:
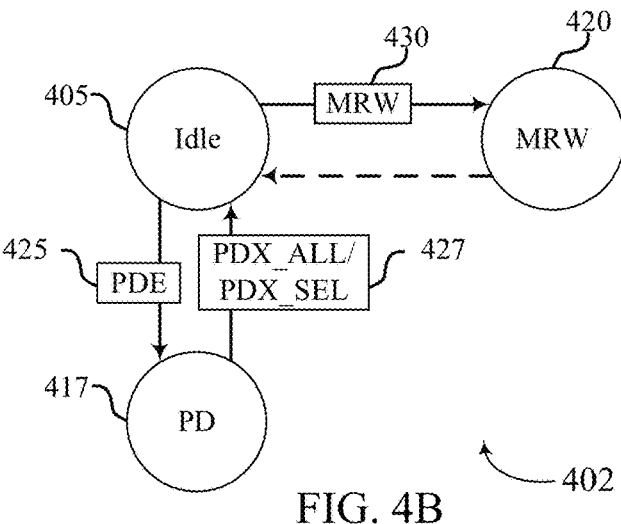

FIG. 4B illustrates an example of a command mode state diagram 402 that supports bank-configurable power modes in accordance with examples as disclosed herein. The features of the command mode state diagram 402 may be performed by a memory device (e.g., the memory device 110, the memory dice 160 or the memory die 200 described with reference to FIGS. 1-2) or one or more components of a memory device such as the memory device controller 155, the local memory controllers 165 or the local memory controller 265 described with reference to FIGS. 1-2. The command mode state diagram 402 may illustrate one or more commands 425, 427 used to switch a memory device between an idle mode 405, which may be an example of the idle mode 305 described with reference to FIG. 3, and a lower power mode 417, which may be an example of the lower power modes 315 (e.g., PD mode) described with reference to FIG. 3. In some cases, the MRW command 430 may be used to write date to one or more mode registers of a memory device as described herein.

A power down enter (PDE) command may be used to switch a memory device into the low power mode 417 (e.g., PD mode). For example, a memory device may be operating in the idle mode 405 and receive the PDE command 425. In response, the memory device may switch from the idle mode 405 to the low power mode 417 (e.g., PD mode). In some cases, the PDE command 425 may include aspects of the PDE command 425 described with reference to FIG. 4A. For example, the PDE command 425 may switch from an idle mode 405 to one or more low power modes 415, 417, which may include different portions of the memory device entering different low power modes (e.g., a first set of banks entering a PD mode and a second set of banks entering a DS mode). In some cases, the assignment of a first portion of the memory device to a first lower power mode 415 (e.g., a DS mode) and a second portion of the memory device to a second low power mode 417 (e.g., a PD mode) may be based data stored at the mode register. Different portions of the memory device may be operated in their respective low power modes until receiving one or more power down exit (PDX) commands.

In some cases, the memory device may receive a first selective exit command 427 (e.g., PDX_SEL) instructing the memory device to switch a portion of the memory device out of the low power mode 417. For example, the selective exit command 427 may be configured to indicate that all memory banks operating in the PD mode 417 are to be switched to the idle mode 405, while maintaining memory banks operating in the DS mode 415. The memory banks operating in the PD mode may switch to the idle mode 405 within the exit time associated with the PD mode.

In some cases, the memory device may receive a second exit command 427 (e.g., PDX_ALL) to switch all memory banks out of the low power mode 417. For example, the exit all command 427 may be configured to indicate that all memory banks operating in the low power mode 415 (e.g., PD mode, DS mode, etc.) are to be switched to the idle mode 405. The memory banks operating in the PD mode may switch to the idle mode 405 in the PD exit time and the memory banks operating in the DS mode may switch to the ide mode 405 in the DS exit time, which may be greater than the PD exit time. In some cases, an exit time may alternatively be referred to as a wakeup time.

Figure 4C:
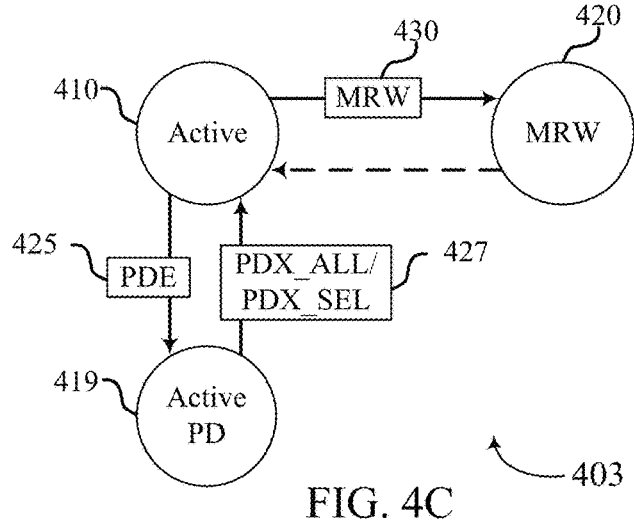

FIG. 4C illustrates an example of a command mode state diagram 403 that supports bank-configurable power modes in accordance with examples as disclosed herein. The features of the command mode state diagram 403 may be performed by a memory device (e.g., the memory device 110, the memory dice 160 or the memory die 200 described with reference to FIGS. 1-2) or one or more components of a memory device such as the memory device controller 155, the local memory controllers 165 or the local memory controller 265 described with reference to FIGS. 1-2. The command mode state diagram 403 may illustrate one or more commands 425, 427 used to switch a memory device between an active mode 410, which may be an example of the active mode 310 described with reference to FIG. 3, and a lower power mode 419, which may be an example of the active power down 325 described with reference to FIG. 3. In some cases, the MRW command 430 may be used to write date to one or more mode registers of a memory device as described herein.

In some cases, a memory device may transition directly between the active mode 410 and the low power mode 419. In cases where a memory device switches directly between the active mode 410 and the low power mode 419, the memory device may enter an active PD mode (e.g., active power down 325 described with reference to FIG. 3) and may not be able to enter a DS mode. For example, when a memory device is operating in the active mode 410 and receives the PDE command 425, the memory device may be configured to switch one or more memory banks to the active PD mode 419.

Figure 5:
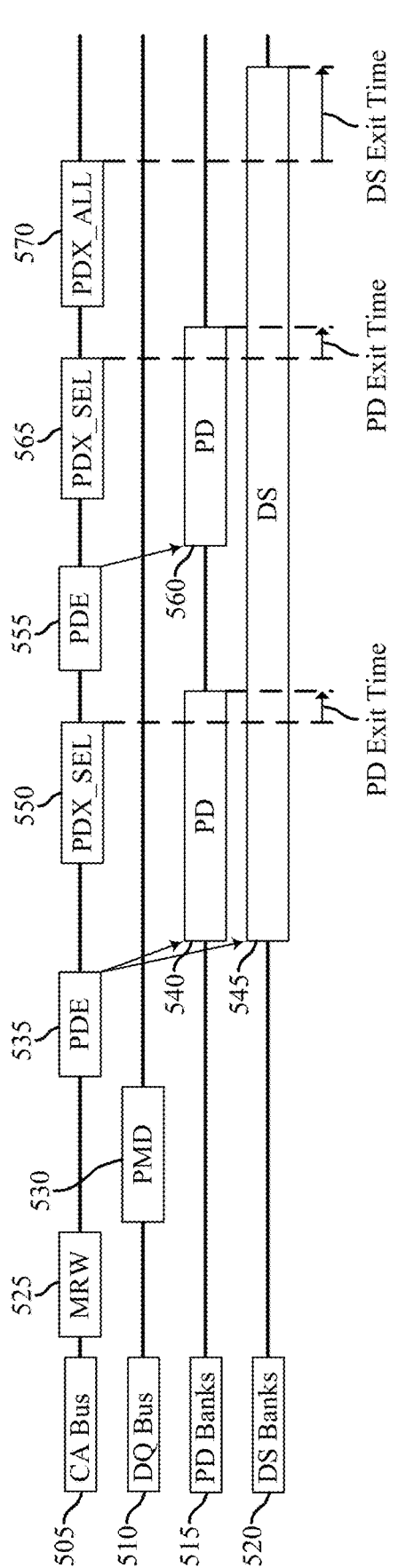
FIG. 5 illustrates an example of a process flow that supports bank-configurable power modes in accordance with examples as disclosed herein.
Figure 5:

FIG. 5 illustrates an example of a process flow 500 that supports bank-configurable power modes in accordance with examples as disclosed herein. The process flow 500 may be performed by a memory device (e.g., the memory device 110, the memory dice 160 or the memory die 200 described with reference to FIGS. 1-2) or one or more components of a memory device such as the memory device controller 155, the local memory controllers 165 or the local memory controller 265 described with reference to FIGS. 1-2. The process flow 500 may illustrate command signals transmitted over one or more channels such as command and address (CA) bus 505 and data (DQ) bus 510, which may be examples of the CA channel 186, the DQ channel 190, or other channels 115 described with reference to FIG. 1. The process flow 500 may also illustrate a PD mode 515 and a DS mode 520, which may indicate when subsets of memory banks are operating in the PD mode and/or DS mode as described herein. The process flow 500 may illustrate a command sequence for switching different subsets of memory banks between different modes (e.g., an idle mode, an active mode, a PD mode or a DS mode).

At a first time, the host device or memory device may determine to transition one or more memory banks to a low power mode. This may be triggered by a variety of factors including an anticipated inactivity period at the memory banks, an inactivity time threshold, a host device command, power constraints/thresholds, or the like. In some cases, the memory device may store data on one or more mode registers that indicates an assignment of different memory banks to different low power modes. In some cases, the memory device may store this data at the mode registers prior to determining to enter a low power mode. For example, a memory device may write the data at start-up or based on receiving a command from a host device. In other cases, the memory device may store this data at the mode registers after determining enter a low power mode. For example, in response to receiving a command to enter a low power mode or in response to a command from a host device.

A memory device may receive an MRW command 525 over the CA bus 505, which may be an example of the MRW command 430 described with reference to FIG. 4. In response to receiving the MRW command 525, the memory device may write, to one or more mode registers, power mode data (PMD) 530 indicating the assignment of different memory banks to different low power modes. In some cases, the PMD 530 may include one or more power mode bit-maps, which are described further in relation to FIGS. 6-8.

In some examples, the memory device may receive the PMD 530 via the DQ bus 510 or other channels (e.g., CA bus 525) and write the PMD 530 to one or more mode resisters of the memory device.

A determination may be made to enter a low power mode and the memory device may receive a PDE command 535 over the CA bus 505, which may be an example of the PDE command 425-*a* described with reference to FIG. 4. The memory device may access the mode register to determine what low power mode the first set of memory banks should be switched to. That is, the memory device may use data stored in the mode register to determine whether the first set of memory banks should be switched to the PD mode or the DS mode. In response to receiving the PDE command 535 and determining that the first set of memory banks should be switched to the PD mode, the memory device may switch a first set of memory banks to a PD mode 540 and a second set of memory banks to a DS mode 545, which may be examples of the PD and DS modes described herein. The first and second sets of memory banks may continue to operate in the respective PD and DS modes until the memory device receives one or more additional commands.

While operating in the low power mode, a host device (or memory device) may determine to perform one or more operations on a portion (subset) of the memory banks in the low power mode. The memory device may receive a PDX_SEL command 550 over the CA bus 505, which may be an example of the PDX_SEL command 425-*b* described with reference to FIG. 4. In response to receiving the PDX_SEL command 550, the memory device may switch the first set of memory banks from the PD mode 540 to an idle or active mode. The first set of memory banks may exit the PD mode in a first duration, which may be referred to as the PD exit time. In some examples, the PD exit time may be faster than a DS exit time. In some examples, the memory device may perform one or more operations at the first set of memory banks such as one or more access operations (e.g., read, write, etc.) while maintaining the second set of the memory banks in the DS mode. Accordingly, the second set of memory banks may continue to operate in a lower power consumption mode, while the first set of memory banks are operating in a higher power consumption mode.

After performing the operations on the first set of memory banks, a host device (or memory device) may determine to switch the first set of memory banks back to a low power mode. In some cases, the first set of banks will be switched to the PD mode to be able to access these banks in a shorter exit time (PD exit time) as compared to DS banks. In other, cases the first set of banks may be switched to the DS mode, which may decrease their power consumption compared to the PD mode but increase their exit time. The memory device may receive a PDE command 555 over the CA bus 505 and access the mode register to determine what low power mode the first set of memory banks should be switched to. That is, the memory device may use data stored in the mode register to determine whether the first set of memory banks should be switched to the PD mode or the DS mode. In response to receiving the PDE command 555 and determining that the first set of memory banks should be switched to the PD mode, the memory device may switch a first set of memory banks back to the PD mode 560.

At a later time, another determination may be made to switch the memory banks out of the low power mode. In some cases, the first set of memory banks may be switched out of the PD mode independently of the second set of memory banks in the DS mode as described above. In some cases, the second set of memory banks may independently be switched out of the DS mode. In some cases, both the first and second sets of memory banks may be switched out of the PD and DS modes using a single command (e.g., PDX_ALL). In one example, the memory device may receive a PDX_SEL command 565 and switch the first set of memory banks from the PD mode. The first set of memory banks may transition to an idle mode or active mode in the PD exit time. Additionally or alternatively, the memory device may receive a PDX_ALL command 570 and switch the second set of memory banks from the DS mode. The second set of memory banks may transition to an idle or active mode in the DS exit time, which may be greater than the PD exit time. Accordingly, the first set of memory banks may be accessed within a quicker time than the second set of memory banks, even when a single PDX_ALL command is received, and the memory device initiates the switching procedure for both sets of memory banks at the same time.

The foregoing description of the process flow 500 in the context of a first set of memory banks and a second set of memory banks is presented to illustrate general concepts related to transitioning portions of memory device to and from different low power modes. Accordingly, this description is not intended to be limiting as these concepts apply to greater numbers of memory banks, different groups or memory banks, other memory devices hierarchy's such as memory die, memory arrays, other groupings of memory cells, or the like or a combination thereof.

Figures 6A, 6B, 6C:
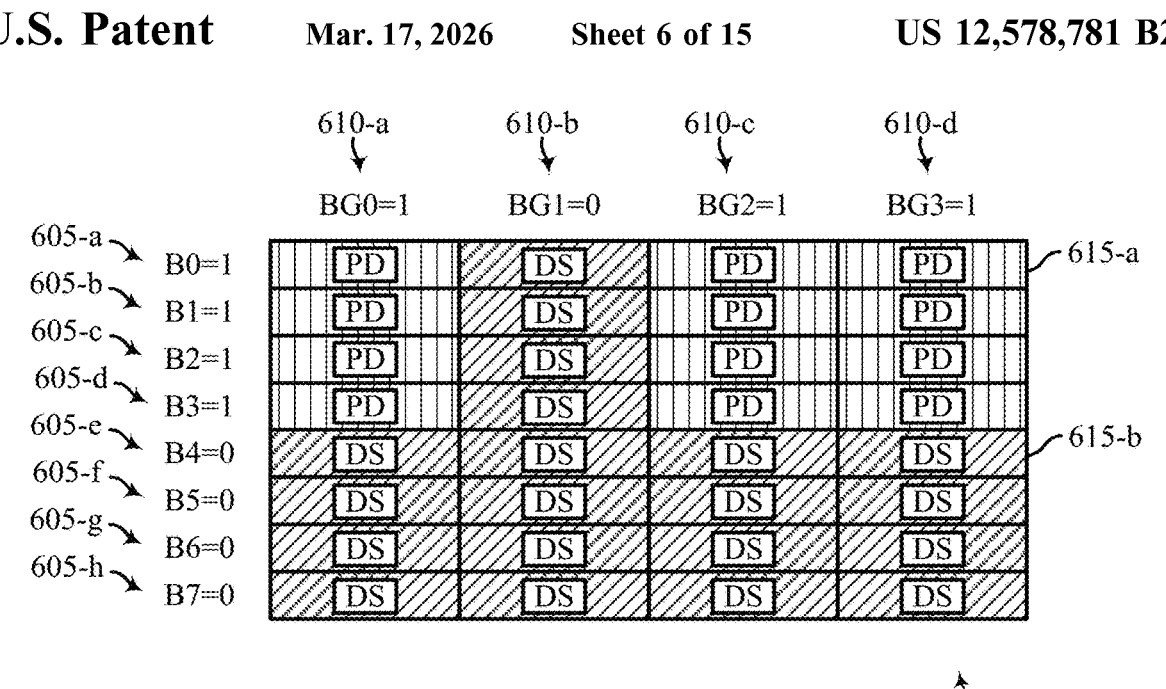
FIGS. 6A-C illustrate examples of a power mode bitmap for a memory device that supports bank-configurable power modes in accordance with examples as disclosed herein.

FIGS. 6A-C illustrates an example of a power mode data that supports bank-configurable power modes in accordance with examples as disclosed herein. The power mode data may include a set of bank mask variables 605 (which may collectively comprise a bank mask) and a set of bank group mask variables 610 (which may collectively comprise a bank group mask), and which in some cases may be written to one or more mode registers of a memory device. A memory device may determine (e.g., in response to a PDE command) the low power mode in which different memory banks 615 are to be operated based on the bank mask variables 605 and the bank group mask variables 610. For example, different memory banks 615 may be switched into different low power modes (e.g., PD, mode and DS mode of varying DS levels as described herein) based on the corresponding power mode data. The bank mask variables 605 and bank group mask variables 610 may be correlated with specific memory banks 615 of a memory device based on a mapping between the fields of the one or more mode registers and the memory banks 615.

FIG. 6A illustrates an example of power mode assignments 601 for a set of memory banks 615 based on corresponding bank mask variables 605 and bank group mask variables 610. FIG. 6B illustrates an example of bitmap formats 602 for writing the corresponding bank mask and bank group mask to one or more mode registers. FIG. 6C illustrates an example of bitmap data 603 that comprises the corresponding bank mask variables 605 and bank group mask variables 610 (indicating the power mode assignments 601 illustrated in FIG. 6A) as written to mode registers in accordance with the bitmap formats 602 illustrated in FIG. 6B. The power mode data illustrated in FIGS. 6A-C may be utilized in accordance with the techniques described herein by a memory device (e.g., the memory device 110, the memory dice 160 or the memory die 200 described with reference to FIGS. 1-2) or one or more components of a memory device, such as the memory device controller 155, the local memory controllers 165, or the local memory controller 265 described with reference to FIGS. 1-2.

FIG. 6A illustrates an example of power mode assignments 601 for a set of memory banks 615 based on corresponding bank mask variables 605 and bank group mask variables 610. For example, a low power mode assigned to each memory bank 615 may be indicated by (and thus determined based on) one or more of a corresponding bank mask variable 605 and a corresponding bank group mask variable 610. In some cases, for a given memory bank 615, a corresponding bank group mask 610 variable may indicate whether (i) the memory bank 615 is to be operated in a first low power mode (e.g., if the corresponding bank group mask 610 variable is a first logic value, such as "0," the memory bank may be operated in the DS mode) or (ii) the memory bank is to be operated in a power mode specified by a second corresponding variable (e.g., if the corresponding bank group mask variable 610 is a second logic value, such as "1," the corresponding bank mask variable 605 may be evaluated to determine whether the memory bank is to be operated in the PD mode or DS mode).

In FIG. 6A, each column of memory banks 615 may correspond to a group of memory banks associated with a same bank group mask variable 610, and each row of memory banks 615 may be associated with a bank number (index) within a group of memory banks and thus a corresponding bank mask variable 605. Thus, each bank group mask variable 610 may be associated with a corresponding column of memory banks 615, and each bank mask variable 605 may be associated with a corresponding row of memory banks 615. It is to be understood that any number of groups of memory banks 615, each including any number of memory banks 615, may be used, and that the memory banks 615 and groups thereof need not be arranged in physical columns and rows as depicted in FIG. 6A.

As shown in the example of FIG. 6A, a first group of memory banks 615 may be associated with bank group mask variable 610-*a* (BG0), a second group of memory banks 615 may be associated with bank group mask variable 610-*b* (BG1), a third group of memory banks 615 may be associated with bank group mask variable 610-*c* (BG2), and a fourth group of memory banks 615 may be associated with bank group mask variable 610-*d* (BG3). The second group of memory banks 615 may all be assigned the DS mode based on setting BG1 to "0." The first, third, and fourth groups of memory banks 615 may be assigned low power modes based on corresponding bank mask variables 605 based on setting BG0, BG2, and BG3 to "1." Within each of the first, third, and fourth groups of memory banks 615, memory banks 615 in a row for which the corresponding bank mask variable 605 is set to "0" may be assigned the DS mode, and memory banks 615 in a row for which the corresponding bank mask variable 605 is "1" may be assigned the PD mode.

The bank mask variables 605 and bank group mask variables 610 may alternatively be considered, explained, or evaluated as indicating, for each memory bank 615, a respective two-variable sequence in which the two variables collectively indicate the assigned low power mode (e.g., based on the combination of variables in the two-variable sequence). For example, a first variable of the two-variable sequence may be the corresponding bank group mask variable 610, and a second variable of the two-variable sequence may be the corresponding bank mask variable 605. Thus, in some cases, memory banks 615 associated with a 00, 01, or 10 sequence may be assigned to a first low power mode (e.g., a DS mode) and memory banks 615 associated with 11 sequence may be assigned to a second low power mode (e.g., a PD mode). Each memory bank 615 may be associated (e.g., based on a mapping to a field of a mode register) with a corresponding bank mask variable 605 and a corresponding bank group mask variable 610.

By way of illustrative example, a first memory bank 615-*a* may be assigned a value for the first variable according to a fourth bank group mask variable 610-*d* (e.g., BG3=1) and a value for the second variable according to the first bank mask variable 605-*a* (e.g., B0=1). Accordingly, the two-variable sequence for the first memory bank 615-*a* is 11, which may indicate that the first memory bank 615-*a* is assigned the PD mode (e.g., is to be switched into the PD mode in response to a PDE command). A second memory bank 615-*b* may be assigned a value for the first variable according to the fourth bank group mask 610-*d* (e.g., BG3=1) and a value for the second variable according to a fifth bank mask variable 605-*c* (e.g., B4=0). Accordingly, the two-variable sequence for the second memory bank 615-*b* is 01, which may be indicate that the second memory bank 615-*b* is assigned the DS mode (e.g., is to be switched into the DS mode in response to a PDE command).

FIG. 6B illustrates an example of bitmap formats 602 for writing the bank mask variables 605 (e.g., as a bank mask) and bank group mask variables 610 (e.g., as a bank group mask) to respective mode registers. The bank mask variables 605 and bank group mask variables 610 may be associated with specific addresses (fields, bit locations) in the mode register such that a memory device may correlate values stored in the mode register to specific memory banks 615. In some cases, the bitmap formats 602 may also include a format for storing data that indicates the DS level (out of multiple possible DS levels) into which the memory device is to switch the memory banks 615 assigned the DS mode. For example, the data that indicates the DS level may indicate whether memory banks assigned the DS mode are to be switched to a first, second, or third DS level (e.g., DS level 320-*a*, DS level 320-*b*, or DS level 320-*c* as described with reference to FIG. 3).

In some cases, the PMD may include a first register entry 620 (e.g., PMD [0]), which may include a first set of values (B0-B7) each written to a specific register field (e.g., one of register fields 0-7). A memory device may be configured to identify that the values in the first register entry 620 correspond to the bank mask variables 605. The memory device may also be configured to identify that each register field (0-7) within the first register entry corresponds to a specific bank mask 605 value. For example, that register field 0 includes the B0 value, register field 1 includes the B1 value, etc. Accordingly, the memory device may access PMD data including the first register entry 620 and determine a value of a bank mask variable 605 (or additionally or alternatively, a value of a second variable in a two-variable sequence) for each memory bank 615.

The PMD may also include a second register entry 625 (e.g., PMD [1]) which may include a second set of values (BG0-BG3) each written to a specific register field (e.g., 0-7). A memory device may be configured to identify that the values in the second register entry 625 correspond to the bank group mask variables 610. The memory device may also be configured to identify that register fields (0-3) within the second register entry correspond to a specific bank group mask 610 value. For example, that register field 0 includes the BG0 value, register field 1 includes the BG1 value, etc. Accordingly, the memory device may access PMD including the second register entry 625 and determine a value of a bank group mask variable 610 (or additionally or alternatively, a value of a first variable in a two-variable sequence) for each memory bank 615.

The memory device may identify a low power mode (e.g., PD mode or DS mode) that each memory bank 615 should be switched into based on the corresponding bank group mask variable 610 and the corresponding bank mask variable 605 (e.g., first and second variables) stored in the PMD and the configured mapping between those variables and the memory banks 615 (e.g., as discussed in relation to FIG. 6A).

In some cases, a third mode register may contain a DS sequence, which may comprise an indication of the DS level into which the memory device is to switch the DS memory banks 615. This may be an option when a memory device supports multiple DS levels, such as DS levels 320 described with reference to FIG. 3. For example, a first DS level (e.g., 320-*a*) may be associated with a first DS sequence (e.g., 01), a second DS level (e.g., 320-*b*) may be associated with a second DS sequence (e.g., 10), and a third DS level may be associated with a third DS sequence (e.g., 11). To identify the DS level, a third register entry 630 may contain a set of values corresponding to one of the DS sequences. Accordingly, the PMD may include the third register entry 630 (e.g., PMD [2]) which may include a third set of values (DS_Level [1] and DS_Level [0]) each written to a specific register field (e.g., 0-1). A memory device may be configured to identify the values in the third register entry 630 as corresponding to the different DS sequences. For example, the first value of the DS sequence may be associated with register field 0 and the second value of the DS sequence may be associated with the register field 1. Accordingly, the memory device may access PMD including a specific DS level associated with the DS memory banks.

FIG. 6C illustrates an example of bitmap values 603 stored to mode registers in accordance with example bitmap formats 602 illustrated in FIG. 6B and that indicate the example power mode assignments 601 illustrated in FIG. 6A. For example, the first register entry 620 (1, 1, 1, 1, 0, 0, 0, 0) corresponds to the example bank mask variable 605 values (B0=1, B1=1, B2=1, B3=1, B4-0, B5-0, B6-0, B7=0), and the second register entry 626 (1, 0, 1, 1) corresponds to the example bank group mask 610 values (BG0=1, BG1=0, BG2=1, BG3=1). Accordingly, a memory device may be configured to access the mode registers, identify the stored bitmap values, and thereby determine which memory banks 615 should be switched into which low power mode (along with which DS level to use for the memory banks 615 assigned the DS mode).

The example presented in FIG. 6 provides an example of a mapping that groups multiple memory banks together for the purpose of assigning a variable sequence. Such a method may allow a fewer number of variables (e.g. 12 mode register values) to assign low power modes to a greater number of banks (e.g., 32 banks). In some case, such as larger memory arrays, this method may provide a solution for storing a relatively small number of variables in mode registers, while still allowing flexibility in terms of assigning different low power modes to different subsets of memory banks 615. The examples presented in FIGS. 7 and 8 respectively illustrate methods for individually assigning each memory bank 615 to a different low power mode (e.g., either a PD mode or a DS mode) and methods for further individually assigning each memory bank 615 that is assigned a DS mode to a specific DS level (e.g., DS levels 320). Accordingly, these methods may provide a greater granularity of control over the low power mode assigned to each memory bank 615 but may store greater amounts of variables at one or more mode registers. In some cases, the methods of FIGS. 6-8 may be combined, modified or otherwise adapted to provide different ways of assigning different low power modes to different memory banks. It is to be understood that different amounts of data (e.g., different numbers of bits within a mode register) may be dedicated to indicating low power mode assignments to memory banks or other portions of a memory device with tradeoffs between granularity and flexibility of control and associated overhead. It is further to be understood that register entries as described herein may be stored in any number of mode registers.

Figures 7A, 7B, 7C:
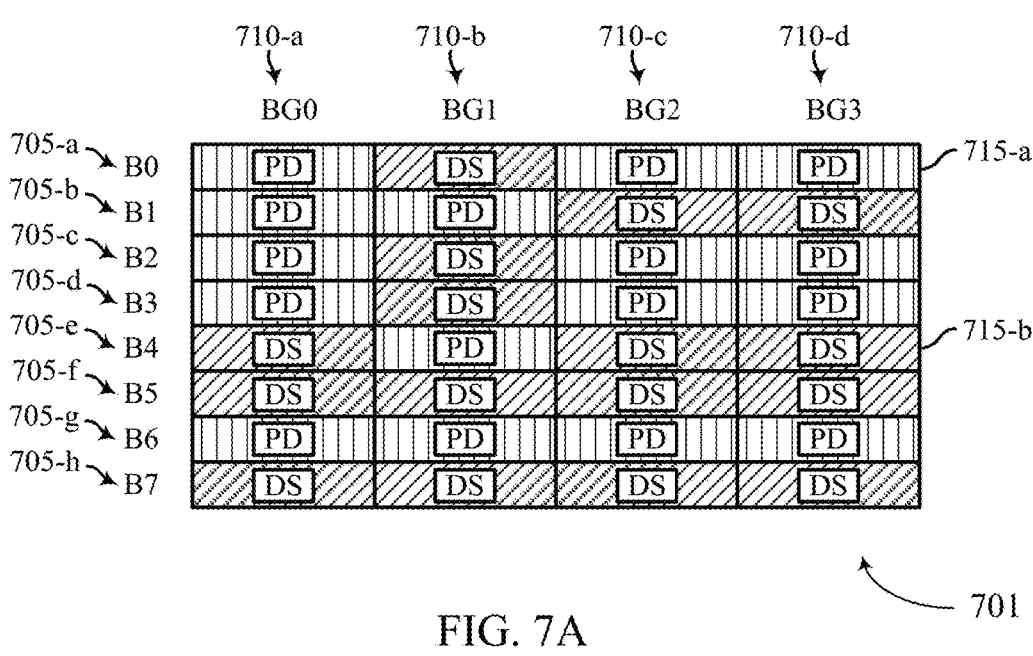
FIGS. 7A-C illustrate examples of a power mode bitmap for a memory device that supports bank-configurable power modes in accordance with examples as disclosed herein.

FIGS. 7A-C illustrates an example of a power mode bitmap 703 that supports bank-configurable power modes in accordance with examples as disclosed herein. The power mode bitmap 703 may include writing PMD to one or more mode registers of a memory device where the PMD indicates an assignment of different memory banks to different low power modes. In the example of FIG. 7, the power mode bitmap 703 may include a unique value for each memory bank of a memory device. A first value (e.g., 0) may be associated with a first low power mode (e.g., a PD mode) and a second value (e.g., 1) may be associated with a second low power mode (e.g., a DS mode). Accordingly, each memory bank can either be assigned to a PD mode or a DS mode based on a mode register value associated with each memory bank. In some cases, the power mode bitmap 703 may include DS level data for assigning one of multiple different DS levels to the DS mode memory banks.

FIG. 7A illustrates an example of memory bank assignments 701 that associate each memory bank 715 with a low power mode. Each memory bank 715 may be associated with a bank mask address 705 and a bank group mask address 710. For example, a first memory bank 715-$a$ may have a unique address corresponding to a first bank mask address 705-$a$ (B0) and a fourth bank group mask address 710-$d$ (BG3). That is, the first memory bank 715-$a$ may be associated with the unique address BG3_B0. By way of another example, a second memory bank 715-$b$ may have a second unique address corresponding to a second bank mask address 705-$e$ (B4) and a second bank group mask address 710-$d$ (BG3). According, the second memory bank 715-$b$ may be associated with the unique address BG3_B4. Each memory bank of a memory device may be associated with a unique address. The unique address may be used to associate each memory bank with a different mode register value that is used to indicate a low power mode for each memory bank.

FIG. 7B illustrates a memory bank association 702 that correlates each unique memory bank address to a specific field in the mode register that may be used to store a value indicating a low power mode for the corresponding memory bank. For example, a first register entry 720 (PMD [0]) may include a unique register field for each memory bank in a first memory bank group mask 710-$a$ (BG0). Further, a first register field (0) may be associated with unique bank address BG0_B0, a second register field (1) may be associated with unique bank address BG0_B1, such that each memory bank in the first bank group mask 710-$a$ (BG0) is assigned to a different register field. In some examples, each register entry 725, 730 and 735 (PMD [1], PMD [2] and PMD [3]) may include a unique register field for each memory bank in their respective groups. Accordingly, a memory device may be configured to associate different mode register locations with a different memory bank.

In some cases, the memory bank association 702 may include a fifth register entry 740 (PMD [4]), which may be used to store values that indicate a DS level for memory banks assigned to the DS mode. In some cases, a single DS level may be specified by the values stored in the fourth register entry 740, which may be an example of the DS levels discussed in relation to FIG. 6.

FIG. 7C illustrates an example of a power mode bitmap 703 stored at the mode register that correspond to the assignment of memory banks to low power modes illustrated in FIG. 7A. For example, the first register entry 720 (e.g., 0, 1, 0, 0, 1, 1, 1, 1) each correspond to a different memory bank in the first bank group mask 710-$a$ (BG0). The second register entry 725 (e.g., 0, 1, 0, 1, 0, 0, 1, 0) each corresponds to a different memory bank in the second bank group mask 710-$b$ (BG1). The third register entry 730 and fourth register entry 735 may contain values that each correspond to different memory banks in the third bank group mask 710-$c$ (BG2) and fourth bank group mask 710-$d$ (BG3), respectively. A memory device may be configured to associate first mode register value (e.g., 0) with a first low power mode and a second register value (e.g., 1) with a second low power mode. In the illustrated example, first register value 0 is associated with the DS mode and the second register value 1 is associated with the PD mode. In this regard, a memory device may be configured to access the power mode bitmap 703 and determine a low power mode for each memory bank. In some cases, the memory device may access the fifth register entry 740 to determine which DS power mode (e.g., DS level) memory banks in the DS mode should be operated in. For example, a first set of values (e.g., 0, 1) may correspond to a first DS level, a second set of values (1,0) may correspond to a second DS level, and a third set of values may correspond to a third DS level.

Figures 8A, 8B, 8C:
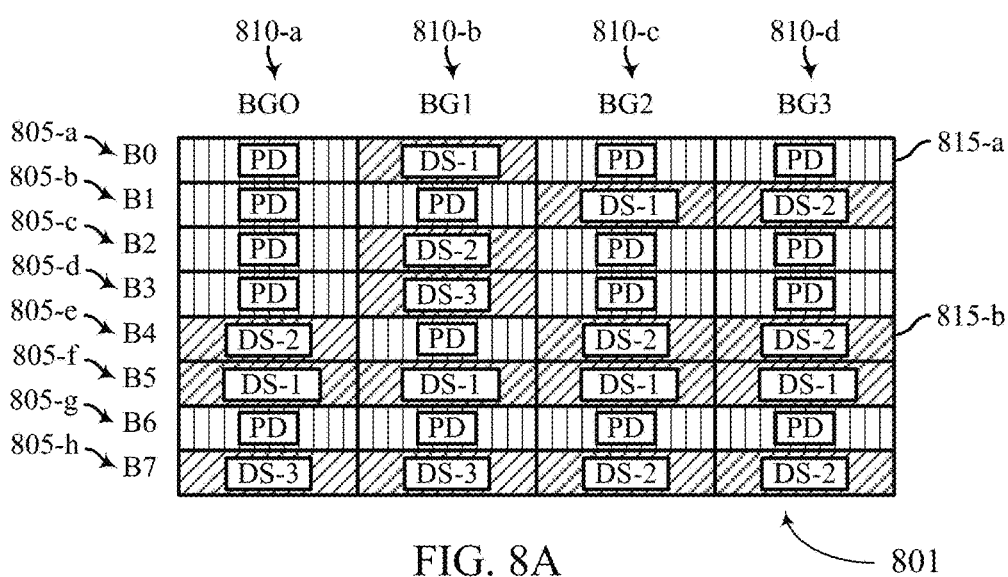
FIGS. 8A-C illustrate examples of a power mode bitmap for a memory device that supports bank-configurable power modes in accordance with examples as disclosed herein.

FIG. 8A-C illustrates an example of a power mode bitmap 803 that supports bank-configurable power modes in accordance with examples as disclosed herein. The power mode bitmap 803 may include writing PMD to one or more mode registers of a memory device where the PMD indicates an assignment of different memory banks to different low power modes. In some cases, the power mode bitmap may also indicate a different DS levels for each memory bank that is assigned a DS mode. In the example of FIG. 8, the power mode bitmap 803 may include two mode register fields for each memory bank of a memory device. The values stored in the two mode register fields may uniquely indicate one or multiple different low power modes. For example, (i) if the two fields associated with a memory bank store a 00 sequence, the memory bank may be assigned to a PD mode, (ii) if the two fields store a 01, the memory bank may be assigned to a DS mode at DS level 1, (iii) if the two fields store a 10, the memory bank may be assigned to a DS mode at DS level 2, and (iv) if the two fields store a 11, the memory bank may be assigned to a DS mode at DS level 3. Accordingly, each memory bank may be individually assigned a low power mode and a DS level based on the two fields in the mode register that are associated with each memory bank.

FIG. 8A illustrates an example of memory bank assignments 801 that associate each memory bank 815 with a low power mode and a DS level for DS memory banks. Each memory bank may be associated with a unique bank address such as described in relation to FIG. 7. Additionally, each memory bank may be associated with a DS level, which may be used for memory banks assigned to the DS mode. For example, a first memory bank 815-$a$ may have a first unique bank that correspond to the PD mode. By way of another example, a second memory bank 815-$b$ may have a second unique bank address corresponding to a DS mode and a DS level 2.

FIG. 8B illustrates a memory bank association 802 that correlates each unique bank addresses to a specific low power mode field and a DS level field by correlating each memory bank to two fields in the mode register. For example, a first register entry (PMD [0]) may include a first register field (e.g., BG0_B0_0) and a second register field (e.g., BG0_B0_1) correlating to each memory bank. The combination of the first register field and the second register field may be used to differentiate between multiple different low power modes. For example, two register field may be able to indicate four different low power states using binary variables (e.g., a different power mode indicated by each unique variable combination—00, 01, 10, 11).

FIG. 8C illustrates an example of a power mode bitmap 803 stored at the mode register that corresponds to the assignment of memory banks to low power modes and DS levels illustrated in FIG. 8A. For example, the first register entry (e.g., 0, 0, 0, 0, 0, 0, 0, 0) has a first value (BG0_B0_0=0) and a second value (BG0_B0_1=0) that corresponds to a low power mode for a memory bank (BG0_B0 memory bank). Accordingly, a memory device may be configured to associate a sequence of mode register field to one of a multitude of low power modes, which may include different DS levels for memory banks operating in a DS mode.

Figure 9:
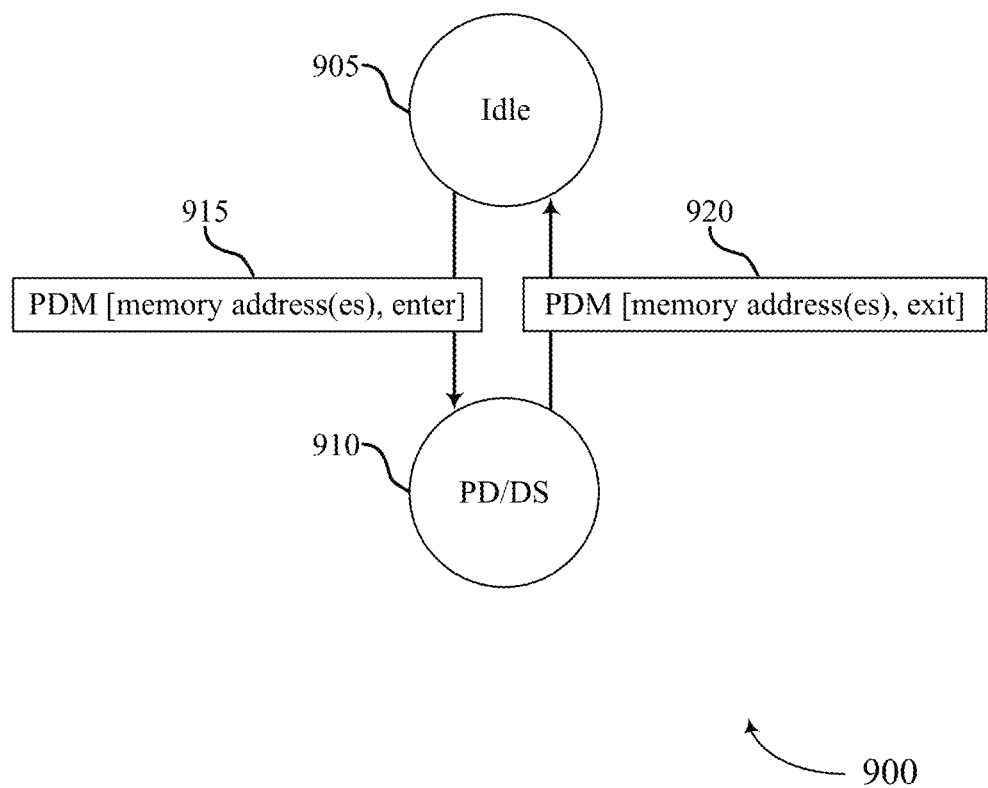
FIG. 9 illustrates an example of a command mode state diagram that supports bank-configurable power modes in accordance with examples as disclosed herein.

FIG. 9 illustrates an example of a command mode state diagram 900 that supports bank-configurable power modes in accordance with examples as disclosed herein. The features of the command mode state diagram 900 may be performed by a memory device (e.g., the memory device 110, the memory dice 160 or the memory die 200 described with reference to FIGS. 1-2) or one or more components of a memory device such as the memory device controller 155, the local memory controllers 165 or the local memory controller 265 described with reference to FIGS. 1-2. The command mode state diagram 900 may illustrate one or more commands 915, 920 used to switch a memory device between an idle mode 905 which may be an example of the idle mode 305 described with reference to FIG. 3 and a lower power mode 910, which may be an example of the low power modes 315, 320 (e.g., PD mode or DS modes) described with reference to FIG. 3.

In some cases, a memory device may be configured via a power down mode (PDM) command 915 that switches one or more banks, bank groups, bank ranges or the like to one or more low power modes. In some examples, the PDM command 915 may switch memory banks to the low power mode without accessing PMD (e.g., a power mode bitmap) stored in a mode register. That is, the PDM command 915 may include information identifying the one or more memory banks to be switched to the low power mode (e.g., while other memory banks may be maintained in whichever mode they were operating at the time the PDM command is received). In some examples the PDM command 915 may also indicate which low power mode (e.g., PD mode, DS mode, or DS level) that the memory banks are to be switched into.

In some examples, the PDM command 915 may switch a single memory bank into a low power mode by specifying a memory bank identifier (e.g., memory bank address) and a low power mode (e.g., PD mode or DS mode). A memory device that receives this command may be configured to identify the memory bank and low power mode indicated in the command and switch that memory bank to the designated low power mode.

In some examples, the PDM command 915 may switch a group of memory banks into a low power mode. The PDM command 915 may include a memory bank group address that is associated with a group of memory banks at a memory device and a low power mode. A memory device may be configured to switch memory banks associated with the memory bank group address into the designated low power mode.

In other examples, the PDM command 915 may switch a range of memory banks into a low power mode. The PDM command 915 may include a first memory bank address that designates a first memory bank in the range, a last memory bank address that designates a last memory bank in the range and a low power mode. A memory device may identify a range of memory banks that includes the memory bank associated with the first address, the memory bank associated with the last address, and any memory banks with addresses that fall between the first and last addresses. The memory device may switch the range of memory banks into the low power mode designated by the PDM command 915.

The memory device may be configured via a PDM exit command 920 that switches one or more portions of the memory device out of the low power mode 910. For example, the PDM exit command 920 may be configured to identify memory banks that are to be switched to the idle mode 905. The memory banks indicated in the PDM exit command 920 operating in one or more low power modes may switch to the idle mode 905 within the exit time associated with their low power mode. In some cases, the PDM exit command 920 and the PDM command 915 may be implemented as a single command that includes a variable in which a value of the variable indicates whether the command comprises a PDM command 915 (to enter a low power mode) or a PDM exit command 920 (to exit a low power mode).

In some examples, the PDM exit command 920 may switch a single memory bank out of a low power mode by specifying a memory bank identifier (e.g., memory bank address). A memory device that receives this command may be configured to identify the memory bank and switch that memory bank to the idle mode 905 or other mode.

In some examples, the PDM exit command 920 may include a memory bank group address that is associated with a group of memory banks at a memory device. A memory device may be configured to switch memory banks associated with the memory bank group address out of the one or more low power modes.

In other examples, the PDM exit command 920 may include a first memory bank address that designates a first memory bank in the range, a last memory bank address that designates a last memory bank in the range. A memory device may identify a range of memory banks that includes the memory bank associated with the first address, the memory bank associated with the last address, and any memory banks with addresses that fall between the first and last addresses. The memory device may switch the range of memory out of the one or more low power modes designated by the PDM exit command 920. In some cases, the PDM exit command 920 could be configured with a variable that switches all of the memory banks out of a low power mode. For example, PDM exit command 920 could include an "all" variable to indicate that each memory bank operating in a low power mode is to be switched to a different mode (e.g., an idle mode). Thus, one or more parameters (e.g., variables) included in a command may indicate the action and the address (of one or more memory banks) corresponding to the command.

Figure 10:
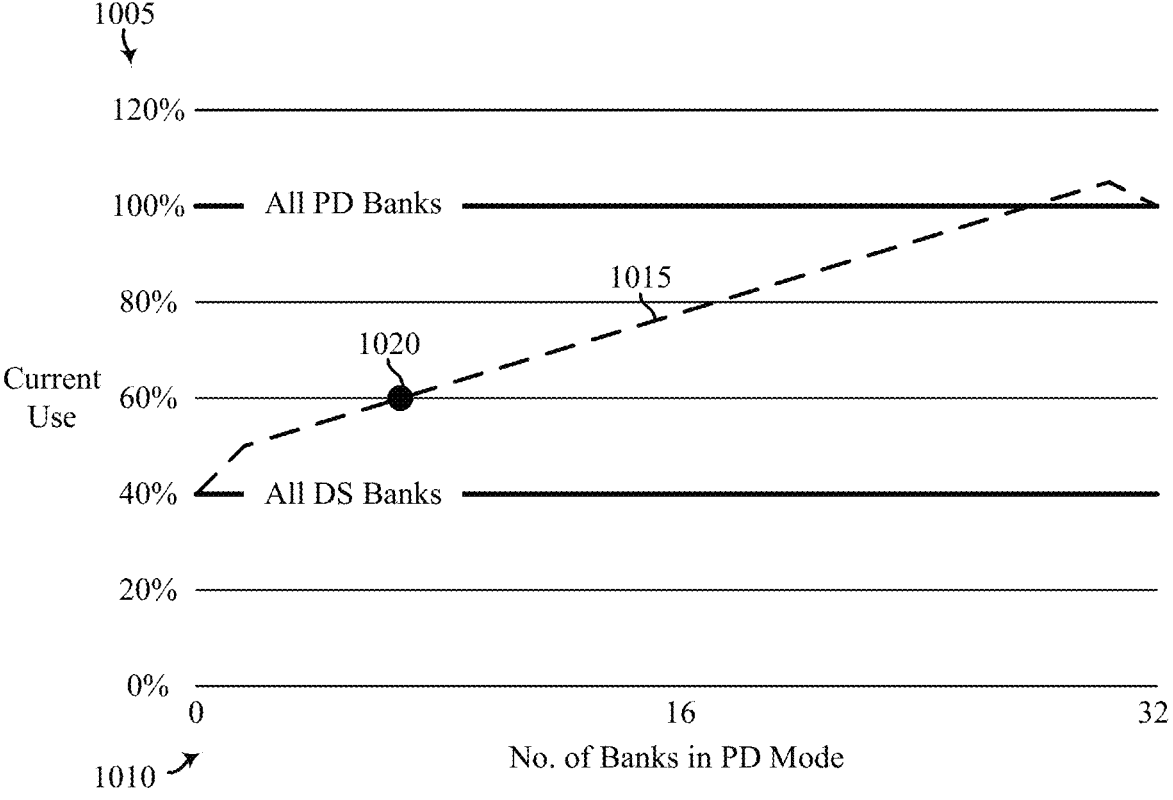
FIG. 10 illustrates an example of a power level consumption profile for a memory device that supports bank-configurable power modes in accordance with examples as disclosed herein.

FIG. 10 illustrates an example of a power level consumption profile 1000 that supports bank-configurable power modes in accordance with examples as disclosed herein. The power level consumption profile 1000 may provide a relative estimate of current use at a memory device based on the number of banks in a PD mode and the number of banks in a DS mode. The power level consumption profile 1000 provides an example for a memory device with thirty-two banks, however this is provided to illustrate the concepts and other quantities of memory banks are possible. The power level consumption profile 1000 may illustrate a relative current use for a memory device operating in one or more low power modes as described herein, such as the memory device 110, the memory dice 160 or the memory die 200 described with reference to FIGS. 1-2, or one or more components of a memory device such as the memory device controller 155, the local memory controllers 165 or the local memory controller 265 described with reference to FIGS. 1-2.

The power level consumption profile 1000 may relate a relative level of current consumption 1005 (y-axis) to the number of memory banks operating in a PD mode 1010 (x-axis). If all banks the memory banks (e.g., 32 memory banks) are operating in the PD mode then the relative current consumption 1005 at the memory device may be classified at 100% and if the none or the memory banks are operating in the PD mode (e.g., all memory banks are in a DS mode) then the relative current consumption 1010 may be 40%. In some cases, different ratios of memory banks operating in the PD mode and the DS mode may be desired, for example, to balance latency (exit time from a low power mode) and power consumption. The current consumption indicator 1015 may characterize the relationship between the ratio of banks in the PD and DS modes and the current consumption. For example, a first index point 1020 may relate the relative current consumption 1005 for a ratio that includes nine memory banks operating in the PD mode and twenty-three memory banks operating in the DS mode. Accordingly, if the memory device is operating nine memory banks in the PD mode and twenty-three banks in the DS mode, the relative current consumption may be 60%.

The memory device may be configured with a power level consumption profile 1000 to determine how many memory banks to operate in each of the PD and DS modes. For example, if the memory device determines to operate at a 60% relative current use 1005, then the memory device would be able to determine that nine banks should be operated in the PD mode and 23 banks should be operated in the DS mode.

Figure 11:
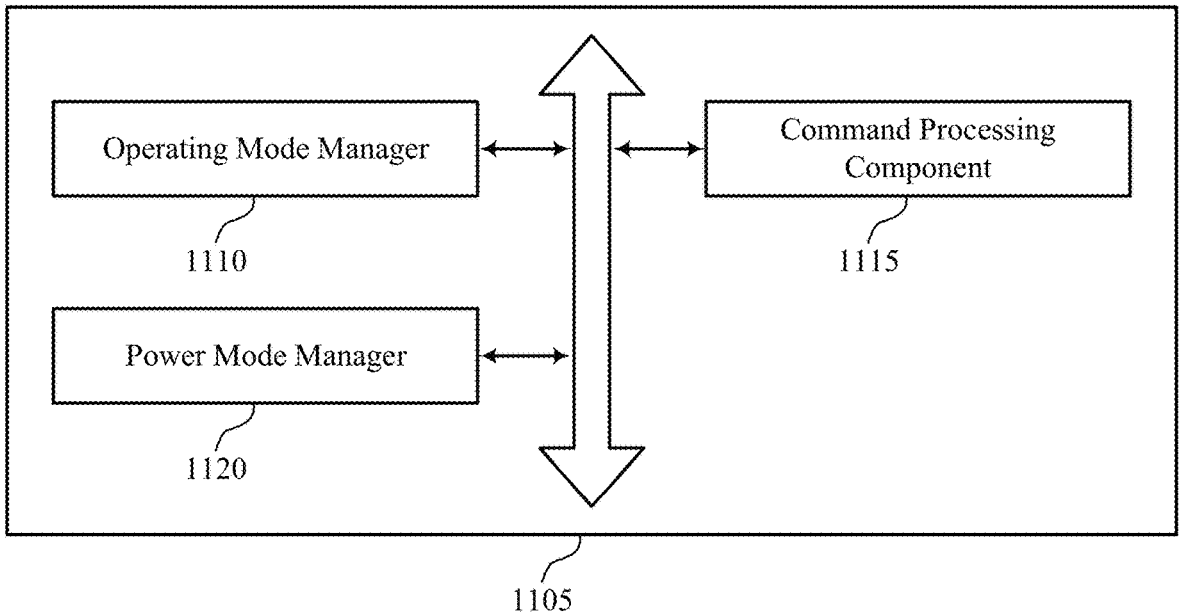
FIG. 11 shows a block diagram of a memory device that supports bank-configurable power modes in accordance with examples as disclosed herein.

FIG. 11 shows a block diagram 1100 of a memory device 1105 that supports bank-configurable power modes in accordance with examples as disclosed herein. The memory device 1105 may be an example of aspects of a memory device as described with reference to FIGS. 1-10. The memory device 1105 may include an operating mode manager 1110, a command processing component 1115, and a power mode manager 1120. Each of these modules may communicate, directly or indirectly, with one another (e.g., via one or more buses).

The operating mode manager 1110 may operate a memory device in a first mode, the memory device including a set of memory banks. In some examples, the operating mode manager 1110 may operate, based on receiving the command and the information, the first memory bank in the first low power mode and the second memory bank in the second low power mode. In some examples, the operating mode manager 1110 may operate a set of memory banks in respective first modes, where the set of memory banks are within a memory device. In some examples, the operating mode manager 1110 may perform an access operation on the first memory bank while the second memory bank is in the second low power mode. In some examples, the operating mode manager 1110 may perform one or more access operations on the first subset of memory banks after switching the first subset of memory banks out of the first low power mode.

The command processing component 1115 may receive, while operating the memory device in the first mode, a command for the memory device to enter a second mode corresponding to less power consumption by the memory device than the first mode. In some examples, the command processing component 1115 may receive, at the memory device, a command to reduce a level of power consumption for the memory device. In some examples, the command processing component 1115 may receive, at the memory device while operating the set of memory banks in the respective first modes, signaling that indicates to operate a first memory bank of the set in a second mode corresponding to a lower power consumption level than a respective first mode for the first memory bank. In some examples, the command processing component 1115 may receive a command for a memory device to enter a reduced power mode from a first power mode. In some examples, the command processing component 1115 may receive, while the first memory bank is in the first low power mode and the second memory bank is in the second low power mode, an exit command associated with the first low power mode.

In some examples, the command processing component 1115 may receive, while operating the memory device in the second mode, a second command to switch the first subset of memory banks from the first low power mode to the first mode. In some examples, the command processing component 1115 may receive, while operating the memory device in the second mode, a third command for the memory device to exit the second mode.

In some examples, the command processing component 1115 may access the one or more mode registers based on receiving the command for the memory device to enter the second mode. In some examples, the command processing component 1115 may receive, at the memory device, second signaling that indicates to operate a third memory bank of the set in a third mode included in the set of low power modes. In some examples, the command processing component 1115 may receive, after switching the first memory bank out of the first low power mode, a second command for the memory device to enter the reduced power mode. In some examples, the command processing component 1115 may receive, while the first memory bank is in the first low power mode and the second memory bank is in the second low power mode, a command for the memory device to exit the reduced power mode. In some examples, the command processing component 1115 may receive, while the first memory bank is not in the first low power mode and the second memory bank is in the second low power mode, a command for the memory device to exit the reduced power mode.

In some cases, the signaling includes an indication of a selected low power mode from the set of low power modes, the selected low power mode being the second mode. In some cases, the signaling includes an identifier specific to the first memory bank. In some cases, the signaling includes an identifier of a group of banks that includes the first memory bank. In some cases, the signaling includes one or more identifiers corresponding to a range of bank addresses that includes a bank address for the first memory bank.

The power mode manager 1120 may switch, based on receiving the command for the memory device to enter the second mode, the memory device into the second mode by switching a first subset of memory banks of the set to a first low power mode corresponding to a first power consumption level and a second subset of memory banks of the set to a second low power mode corresponding to a second power consumption level that is lower than the first power consumption level. In some examples, the power mode manager 1120 may write, to one or more mode registers of a memory device, information that assigns a first low power mode to a first memory bank of the memory device and a second low power mode to a second memory bank of the memory device. In some examples, the power mode manager 1120 may switch, based on receiving the signaling, the first memory bank from the respective first mode for the first memory bank to the second mode while maintaining a second memory bank of the set in a respective first mode for the second memory bank.

In some examples, the power mode manager 1120 may switch a first memory bank of the memory device to a first low power mode based on receiving the command, the first low power mode associated with a first power consumption level. In some examples, the power mode manager 1120 may switch a second memory bank of the memory device to a second low power mode based on receiving the command, the second low power mode associated with a second power consumption level that is lower than the first power consumption level. In some examples, the power mode manager 1120 may switch, based on receiving the exit command, the first memory bank out of the first low power mode while maintaining the second memory bank in the second low power mode. In some examples, the power mode manager 1120 may switch, based on receiving the second command, the first subset of memory banks out of the first low power mode.

In some examples, the power mode manager 1120 may maintain the second subset of memory banks in the second low power mode while switching the first subset of memory banks out of the first low power mode. In some examples, the power mode manager 1120 may maintain the second subset of memory banks in the second low power mode while performing the one or more access operations on the first subset of memory banks. In some examples, the power mode manager 1120 may switch, based on receiving the second command, the memory device out of the second mode by switching the first subset of memory banks out of the first low power mode and the second subset of memory banks out of the second low power mode. In some examples, the power mode manager 1120 may receive an indication of the second power consumption level, where the second power consumption level corresponds to one of a set of power consumption levels supported by the memory device for the second low power mode.

In some examples, the power mode manager 1120 may receive information indicating an assignment of the first low power mode to the first subset of memory banks and the second low power mode to the second subset of memory banks. In some examples, the power mode manager 1120 may write an indication of the assignment to one or more mode registers. In some examples, the power mode manager 1120 may identify the first low power mode for the first subset of memory banks and the second low power mode for the second subset of memory banks based on the accessing, where the switching the first subset of memory banks to the first low power mode and the second subset of memory banks to the second low power mode is based on the identifying.

In some examples, the power mode manager 1120 may write an indication of the power consumption level associated with the second low power mode to the one or more mode registers. In some examples, the power mode manager 1120 may read, based on receiving the command, the one or more mode registers. In some examples, the power mode manager 1120 may determine to operate the first memory bank in the first low power mode and the second memory bank in the second low power mode based on reading the one or more mode registers, where the operating is based on the determining. In some examples, the power mode manager 1120 may write a first set of values and a second set of values, where each of a set of memory banks included in the memory device is associated with a corresponding low power mode based on a respective combination of a first value from the first set of values and a second value from the second set of values.

In some examples, the power mode manager 1120 may write an indication of a power consumption level associated with the second low power mode. In some examples, the power mode manager 1120 may write, for each of a set of memory banks included in the memory device, a respective indication of the first low power mode or the second low power mode. In some examples, the power mode manager 1120 may write, for each of a set of memory banks included in the memory device, a respective indication of one of a set of low power modes, the set of low power modes including the first low power mode, the second low power mode with a first power consumption level, and the second low power mode with a second power consumption level.

In some examples, the power mode manager 1120 may switch, based on receiving the second signaling, the third memory bank from a respective first mode for the third memory bank to the third mode while maintaining the first memory bank in the second mode. In some examples, the power mode manager 1120 may switch the first memory bank to the first low power mode based on receiving the second command. In some examples, the power mode manager 1120 may switch the first memory bank out of the first low power mode and the second memory bank out of the second low power mode based on receiving the command for the memory device to exit the reduced power mode.

In some examples, the power mode manager 1120 may, based on the command for the memory device to exit the reduced power mode, make the first memory bank is available for access before the second memory bank is available for access. In some examples, the power mode manager 1120 may switch the second memory bank out of the second low power mode based on receiving the command for the memory device to exit the reduced power mode.

In some cases, the first low power mode corresponds to a quicker wakeup time than the second low power mode. In some cases, the indication of the assignment includes one or more bitmaps that associate the first subset of memory banks with the first low power mode and the second subset of memory banks with the second low power mode. In some cases, the second mode is one of a set of low power modes supported by the memory device for the set of memory banks, each of the set of low power modes corresponding to a respective power consumption level that is lower than a power consumption level corresponding to an idle mode supported by the memory device for the set of memory banks.

FIG. 12 shows a flowchart illustrating a method or methods 1200 that supports bank-configurable power modes in accordance with aspects of the present disclosure. The operations of method 1200 may be implemented by a memory device or its components as described herein. For example, the operations of method 1200 may be performed by a memory device as described with reference to FIG. 11. In some examples, a memory device may execute a set of instructions to control the functional elements of the memory device to perform the described functions. Additionally or alternatively, a memory device may perform aspects of the described functions using special-purpose hardware.

At 1205, the memory device may operate a memory device in a first mode, the memory device including a set of memory banks. The operations of 1205 may be performed according to the methods described herein. In some examples, aspects of the operations of 1205 may be performed by an operating mode manager as described with reference to FIG. 11.

At 1210, the memory device may receive, while operating the memory device in the first mode, a command for the memory device to enter a second mode corresponding to less power consumption by the memory device than the first mode. The operations of 1210 may be performed according to the methods described herein. In some examples, aspects of the operations of 1210 may be performed by a command processing component as described with reference to FIG. 11.

At 1215, the memory device may switch, based on receiving the command for the memory device to enter the second mode, the memory device into the second mode by switching a first subset of memory banks of the set to a first low power mode corresponding to a first power consumption level and a second subset of memory banks of the set to a second low power mode corresponding to a second power consumption level that is lower than the first power consumption level. The operations of 1215 may be performed according to the methods described herein. In some examples, aspects of the operations of 1215 may be performed by a power mode manager as described with reference to FIG. 11.

In some examples, an apparatus as described herein may perform a method or methods, such as the method 1200. The apparatus may include features, means, or instructions (e.g., a non-transitory computer-readable medium storing instructions executable by a processor) for operating a memory device in a first mode, the memory device including a set of memory banks, receiving, while operating the memory device in the first mode, a command for the memory device to enter a second mode corresponding to less power consumption by the memory device than the first mode, and switching, based on receiving the command for the memory device to enter the second mode, the memory device into the second mode by switching a first subset of memory banks of the set to a first low power mode corresponding to a first power consumption level and a second subset of memory banks of the set to a second low power mode corresponding to a second power consumption level that is lower than the first power consumption level.

Some examples of the method 1200 and the apparatus described herein may further include operations, features, means, or instructions for receiving, while operating the memory device in the second mode, a second command to switch the first subset of memory banks from the first low power mode to the first mode, and switching, based on receiving the second command, the first subset of memory banks out of the first low power mode.

Some examples of the method 1200 and the apparatus described herein may further include operations, features, means, or instructions for maintaining the second subset of memory banks in the second low power mode while switching the first subset of memory banks out of the first low power mode.

Some examples of the method 1200 and the apparatus described herein may further include operations, features, means, or instructions for performing one or more access operations on the first subset of memory banks after switching the first subset of memory banks out of the first low power mode, and maintaining the second subset of memory banks in the second low power mode while performing the one or more access operations on the first subset of memory banks.

Some examples of the method 1200 and the apparatus described herein may further include operations, features, means, or instructions for receiving, while operating the memory device in the second mode, a third command for the memory device to exit the second mode, and switching, based on receiving the second command, the memory device out of the second mode by switching the first subset of memory banks out of the first low power mode and the second subset of memory banks out of the second low power mode.

In some examples of the method 1200 and the apparatus described herein, the first low power mode corresponds to a quicker wakeup time than the second low power mode.

Some examples of the method 1200 and the apparatus described herein may further include operations, features, means, or instructions for receiving an indication of the second power consumption level, where the second power consumption level corresponds to one of a set of power consumption levels supported by the memory device for the second low power mode.

Some examples of the method 1200 and the apparatus described herein may further include operations, features, means, or instructions for receiving information indicating an assignment of the first low power mode to the first subset of memory banks and the second low power mode to the second subset of memory banks, and writing an indication of the assignment to one or more mode registers.

Some examples of the method 1200 and the apparatus described herein may further include operations, features, means, or instructions for accessing the one or more mode registers based on receiving the command for the memory device to enter the second mode, and identifying the first low power mode for the first subset of memory banks and the second low power mode for the second subset of memory banks based on the accessing, where the switching the first subset of memory banks to the first low power mode and the second subset of memory banks to the second low power mode may be based on the identifying.

In some examples of the method 1200 and the apparatus described herein, the indication of the assignment includes one or more bitmaps that associate the first subset of memory banks with the first low power mode and the second subset of memory banks with the second low power mode.

Some examples of the method 1200 and the apparatus described herein may further include operations, features, means, or instructions for writing an indication of the power consumption level associated with the second low power mode to the one or more mode registers.

FIG. 13 shows a flowchart illustrating a method or methods 1300 that supports bank-configurable power modes in accordance with aspects of the present disclosure. The operations of method 1300 may be implemented by a memory device or its components as described herein. For example, the operations of method 1300 may be performed by a memory device as described with reference to FIG. 11. In some examples, a memory device may execute a set of instructions to control the functional elements of the memory device to perform the described functions. Additionally or alternatively, a memory device may perform aspects of the described functions using special-purpose hardware.

At 1305, the memory device may write, to one or more mode registers of a memory device, information that assigns a first low power mode to a first memory bank of the memory device and a second low power mode to a second memory bank of the memory device. The operations of 1305 may be performed according to the methods described herein. In some examples, aspects of the operations of 1305 may be performed by a power mode manager as described with reference to FIG. 11.

At 1310, the memory device may receive, at the memory device, a command to reduce a level of power consumption for the memory device. The operations of 1310 may be performed according to the methods described herein. In some examples, aspects of the operations of 1310 may be performed by a command processing component as described with reference to FIG. 11.

At 1315, the memory device may operate, based on receiving the command and the information, the first memory bank in the first low power mode and the second memory bank in the second low power mode. The operations of 1315 may be performed according to the methods described herein. In some examples, aspects of the operations of 1315 may be performed by an operating mode manager as described with reference to FIG. 11.

In some examples, an apparatus as described herein may perform a method or methods, such as the method 1300. The apparatus may include features, means, or instructions (e.g., a non-transitory computer-readable medium storing instructions executable by a processor) for writing, to one or more mode registers of a memory device, information that assigns a first low power mode to a first memory bank of the memory device and a second low power mode to a second memory bank of the memory device, receiving, at the memory device, a command to reduce a level of power consumption for the memory device, and operating, based on receiving the command and the information, the first memory bank in the first low power mode and the second memory bank in the second low power mode.

Some examples of the method 1300 and the apparatus described herein may further include operations, features, means, or instructions for reading, based on receiving the command, the one or more mode registers, and determining to operate the first memory bank in the first low power mode and the second memory bank in the second low power mode based on reading the one or more mode registers, where the operating may be based on the determining.

In some examples of the method 1300 and the apparatus described herein, writing the information to the one or more mode registers may include operations, features, means, or instructions for writing a first set of values and a second set of values, where each of a set of memory banks included in the memory device may be associated with a corresponding low power mode based on a respective combination of a first value from the first set of values and a second value from the second set of values.

In some examples of the method 1300 and the apparatus described herein, writing the information to the one or more mode registers may include operations, features, means, or instructions for writing an indication of a power consumption level associated with the second low power mode.

In some examples of the method 1300 and the apparatus described herein, writing the information to the one or more mode registers may include operations, features, means, or instructions for writing, for each of a set of memory banks included in the memory device, a respective indication of the first low power mode or the second low power mode.

In some examples of the method 1300 and the apparatus described herein, writing the information to the one or more mode registers may include operations, features, means, or instructions for writing, for each of a set of memory banks included in the memory device, a respective indication of one of a set of low power modes, the set of low power modes including the first low power mode, the second low power mode with a first power consumption level, and the second low power mode with a second power consumption level.

FIG. 14 shows a flowchart illustrating a method or methods 1400 that supports bank-configurable power modes in accordance with aspects of the present disclosure. The operations of method 1400 may be implemented by a memory device or its components as described herein. For example, the operations of method 1400 may be performed by a memory device as described with reference to FIG. 11. In some examples, a memory device may execute a set of instructions to control the functional elements of the memory device to perform the described functions. Additionally or alternatively, a memory device may perform aspects of the described functions using special-purpose hardware.

At 1405, the memory device may operate a set of memory banks in respective first modes, where the set of memory banks are within a memory device. The operations of 1405 may be performed according to the methods described herein. In some examples, aspects of the operations of 1405 may be performed by an operating mode manager as described with reference to FIG. 11.

At 1410, the memory device may receive, at the memory device while operating the set of memory banks in the respective first modes, signaling that indicates to operate a first memory bank of the set in a second mode corresponding to a lower power consumption level than a respective first mode for the first memory bank. The operations of 1410 may be performed according to the methods described herein. In some examples, aspects of the operations of 1410 may be performed by a command processing component as described with reference to FIG. 11.

At 1415, the memory device may switch, based on receiving the signaling, the first memory bank from the respective first mode for the first memory bank to the second mode while maintaining a second memory bank of the set in a respective first mode for the second memory bank. The operations of 1415 may be performed according to the methods described herein. In some examples, aspects of the operations of 1415 may be performed by a power mode manager as described with reference to FIG. 11.

In some examples, an apparatus as described herein may perform a method or methods, such as the method 1400. The apparatus may include features, means, or instructions (e.g., a non-transitory computer-readable medium storing instructions executable by a processor) for operating a set of memory banks in respective first modes, where the set of memory banks are within a memory device, receiving, at the memory device while operating the set of memory banks in the respective first modes, signaling that indicates to operate a first memory bank of the set in a second mode corresponding to a lower power consumption level than a respective first mode for the first memory bank, and switching, based on receiving the signaling, the first memory bank from the respective first mode for the first memory bank to the second mode while maintaining a second memory bank of the set in a respective first mode for the second memory bank.

In some examples of the method 1400 and the apparatus described herein, the second mode may be one of a set of low power modes supported by the memory device for the set of memory banks, each of the set of low power modes corresponding to a respective power consumption level that may be lower than a power consumption level corresponding to an idle mode supported by the memory device for the set of memory banks, and the signaling includes an indication of a selected low power mode from the set of low power modes, the selected low power mode being the second mode.

Some examples of the method 1400 and the apparatus described herein may further include operations, features, means, or instructions for receiving, at the memory device, second signaling that indicates to operate a third memory bank of the set in a third mode included in the set of low power modes, and switching, based on receiving the second signaling, the third memory bank from a respective first mode for the third memory bank to the third mode while maintaining the first memory bank in the second mode.

In some examples of the method 1400 and the apparatus described herein, the signaling includes an identifier specific to the first memory bank.

In some examples of the method 1400 and the apparatus described herein, the signaling includes an identifier of a group of banks that includes the first memory bank.

In some examples of the method 1400 and the apparatus described herein, the signaling includes one or more identifiers corresponding to a range of bank addresses that includes a bank address for the first memory bank.

FIG. 15 shows a flowchart illustrating a method or methods 1500 that supports bank-configurable power modes in accordance with aspects of the present disclosure. The operations of method 1500 may be implemented by a memory device or its components as described herein. For example, the operations of method 1500 may be performed by a memory device as described with reference to FIG. 11. In some examples, a memory device may execute a set of instructions to control the functional elements of the memory device to perform the described functions. Additionally or alternatively, a memory device may perform aspects of the described functions using special-purpose hardware.

At 1505, the memory device may receive a command for a memory device to enter a reduced power mode from a first power mode. The operations of 1505 may be performed according to the methods described herein. In some examples, aspects of the operations of 1505 may be performed by a command processing component as described with reference to FIG. 11.

At 1510, the memory device may switch a first memory bank of the memory device to a first low power mode based on receiving the command, the first low power mode associated with a first power consumption level. The operations of 1510 may be performed according to the methods described herein. In some examples, aspects of the operations of 1510 may be performed by a power mode manager as described with reference to FIG. 11.

At 1515, the memory device may switch a second memory bank of the memory device to a second low power mode based on receiving the command, the second low power mode associated with a second power consumption level that is lower than the first power consumption level. The operations of 1515 may be performed according to the methods described herein. In some examples, aspects of the operations of 1515 may be performed by a power mode manager as described with reference to FIG. 11.

At 1520, the memory device may receive, while the first memory bank is in the first low power mode and the second memory bank is in the second low power mode, an exit command associated with the first low power mode. The operations of 1520 may be performed according to the methods described herein. In some examples, aspects of the operations of 1520 may be performed by a command processing component as described with reference to FIG. 11.

At 1525, the memory device may switch, based on receiving the exit command, the first memory bank out of the first low power mode while maintaining the second memory bank in the second low power mode. The operations of 1525 may be performed according to the methods described herein. In some examples, aspects of the operations of 1525 may be performed by a power mode manager as described with reference to FIG. 11.

At 1530, the memory device may perform an access operation on the first memory bank while the second memory bank is in the second low power mode. The operations of 1530 may be performed according to the methods described herein. In some examples, aspects of the operations of 1530 may be performed by an operating mode manager as described with reference to FIG. 11.

In some examples, an apparatus as described herein may perform a method or methods, such as the method 1500. The apparatus may include features, means, or instructions (e.g., a non-transitory computer-readable medium storing instructions executable by a processor) for receiving a command for a memory device to enter a reduced power mode from a first power mode, switching a first memory bank of the memory device to a first low power mode based on receiving the command, the first low power mode associated with a first power consumption level, switching a second memory bank of the memory device to a second low power mode based on receiving the command, the second low power mode associated with a second power consumption level that is lower than the first power consumption level, receiving, while the first memory bank is in the first low power mode and the second memory bank is in the second low power mode, an exit command associated with the first low power mode, switching, based on receiving the exit command, the first memory bank out of the first low power mode while maintaining the second memory bank in the second low power mode, and performing an access operation on the first memory bank while the second memory bank is in the second low power mode.

Some examples of the method 1500 and the apparatus described herein may further include operations, features, means, or instructions for receiving, after switching the first memory bank out of the first low power mode, a second command for the memory device to enter the reduced power mode, and switching the first memory bank to the first low power mode based on receiving the second command.

Some examples of the method 1500 and the apparatus described herein may further include operations, features, means, or instructions for receiving, while the first memory bank may be in the first low power mode and the second memory bank may be in the second low power mode, a command for the memory device to exit the reduced power mode, and switching the first memory bank out of the first low power mode and the second memory bank out of the second low power mode based on receiving the command for the memory device to exit the reduced power mode.

Some examples of the method 1500 and the apparatus described herein may further include operations, features, means, or instructions for, based on the command for the memory device to exit the reduced power mode, the first memory bank may be available for access before the second memory bank may be available for access.

Some examples of the method 1500 and the apparatus described herein may further include operations, features, means, or instructions for receiving, while the first memory bank may be not in the first low power mode and the second memory bank may be in the second low power mode, a command for the memory device to exit the reduced power mode, and switching the second memory bank out of the second low power mode based on receiving the command for the memory device to exit the reduced power mode.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of memory banks within a memory device, where each memory bank of the set supports an access mode, a first low power mode corresponding to less power consumption than the access mode, and a second low power mode corresponding to less power consumption than the first low power mode and a controller coupled with the set of memory banks and configured to cause the apparatus to operate at least one memory bank of the set in a selected mode including one of the access mode, the first low power mode, or the second low power mode independent of whether other memory banks of the set are in the access mode, the first low power mode, or the second low power mode.

Some examples of the apparatus may include one or more mode registers configured to store an assignment of the first low power mode to a first subset of the set of memory banks and the second low power mode to a second subset of the set of memory banks.

Some examples may further include access the one or more mode registers based on the memory device receiving a command to reduce an amount of power consumption for the memory device, and operate the first subset of the set of memory banks in the first low power mode and the second subset of the set of memory banks in the second low power mode based on accessing the one or more mode registers.

In some examples, a power consumption level for the second low power mode may be selectable from among a set of power consumption levels, and the one or more mode registers may be further configured to store an indication of a selected power consumption level for the second low power mode.

Some examples may further include switching a first subset of the set of memory banks out of the first low power mode and maintain a second subset of the set of memory banks in the second low power mode based on at least in part on the memory device receiving an exit command for the first low power mode.

In some examples, each of the set of memory banks may be configured to be available for access operations with a first latency when switched out of the first low power mode and available for access operations with a second latency when switched out of the second low power mode, the first latency shorter than the second latency.

Some examples may further include operating a first subset of the set of memory banks in the first low power mode and a second subset of the set of memory banks in the second low power mode based on the memory device receiving one or more commands indicating the first low power mode for the first subset of the set of memory banks and the second low power mode for the second subset of the set of memory banks.

It is to be understand that aspects described herein with reference to mode registers or related commands (e.g., MRW commands) may also be implemented using other types of registers or any other type of storage and related commands (e.g., commands to read or write such other types of registers or storage).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

Though examples herein may in some cases be described in terms of one or more types of memory devices (e.g., DRAM or FeRAM memory devices), it is to be understood that the teachings herein may be applied to any type of memory device.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
operating a plurality of memory banks in respective first modes, wherein the plurality of memory banks are within one or more memory devices;
receiving, via a command bus and at the one or more memory devices while operating the plurality of memory banks in the respective first modes, a single command that comprises a bitmap that indicates to operate a first memory bank of the plurality in a second mode corresponding to a lower power consumption level than a respective first mode for the first memory bank, wherein each bit of the bitmap indicates a respective mode of one or more memory banks of the plurality of memory banks; and
switching, based at least in part on receiving the bitmap, the first memory bank from the respective first mode for the first memory bank to the second mode while maintaining a second memory bank of the plurality in a respective first mode for the second memory bank.

2. The method of claim 1, wherein:
the second mode is one of a plurality of low power modes supported by the one or more memory devices for the plurality of memory banks, each of the plurality of low power modes corresponding to a respective power consumption level that is lower than a power consumption level corresponding to an idle mode supported by the one or more memory devices for the plurality of memory banks; and
the bitmap comprises an indication of a selected low power mode from the plurality of low power modes, the selected low power mode being the second mode.

3. The method of claim 2, further comprising:
receiving, at the one or more memory devices, signaling that indicates to operate a third memory bank of the plurality in a third mode included in the plurality of low power modes; and

switching, based at least in part on receiving the signaling, the third memory bank from a respective first mode for the third memory bank to the third mode while maintaining the first memory bank in the second mode.

4. The method of claim 3, wherein the third mode corresponds to a lower power consumption level than the second mode.

5. The method of claim 3, further comprising:
switching, during a first duration, the first memory bank from the second mode to the respective first mode for the first memory bank; and
switching, during a second duration greater than the first duration, the third memory bank from the third mode to the respective first mode for the third memory bank.

6. The method of claim 5, further comprising:
receiving, at the one or more memory devices, a command for the first memory bank to exit the second mode and for the third memory bank to exit the third mode, wherein switching the first memory bank and switching the third memory bank is based at least in part on receiving the command.

7. The method of claim 1, wherein the bitmap comprises an identifier specific to the first memory bank.

8. The method of claim 1, wherein the bitmap comprises an identifier of a group of banks that includes the first memory bank.

9. The method of claim 1, wherein the single command comprises one or more identifiers corresponding to a range of bank addresses that includes a bank address for the first memory bank.

10. A memory system, comprising:
one or more memory devices; and
processing circuitry coupled with the one or more memory devices and configured to cause the memory system to:
operate a plurality of memory banks in respective first modes, wherein the plurality of memory banks are within the one or more memory devices;
receive, via a command bus and at the memory system while operating the plurality of memory banks in the respective first modes, a single command that comprises a bitmap that indicates to operate a first memory bank of the plurality in a second mode corresponding to a lower power consumption level than a respective first mode for the first memory bank, wherein each bit of the bitmap indicates a respective mode of one or more memory banks of the plurality of memory banks; and
switch, based at least in part on receiving the bitmap, the first memory bank from the respective first mode for the first memory bank to the second mode while maintaining a second memory bank of the plurality in a respective first mode for the second memory bank.

11. The memory system of claim 10, wherein:
the second mode is one of a plurality of low power modes supported by the one or more memory devices for the plurality of memory banks, each of the plurality of low power modes corresponding to a respective power consumption level that is lower than a power consumption level corresponding to an idle mode supported by the one or more memory devices for the plurality of memory banks; and
the bitmap comprises an indication of a selected low power mode from the plurality of low power modes, the selected low power mode being the second mode.

12. The memory system of claim 11, wherein the processing circuitry is further configured to cause the memory system to:

receive, at the one or more memory devices, signaling that indicates to operate a third memory bank of the plurality in a third mode included in the plurality of low power modes; and switch, based at least in part on receiving the signaling, the third memory bank from a respective first mode for the third memory bank to the third mode while maintaining the first memory bank in the second mode.

13. The memory system of claim 12, wherein the third mode corresponds to a lower power consumption level than the second mode.

14. The memory system of claim 12, further comprising:

switching, during a first duration, the first memory bank from the second mode to the respective first mode for the first memory bank; and switching, during a second duration greater than the first duration, the third memory bank from the third mode to the respective first mode for the third memory bank.

15. The memory system of claim 14, further comprising:

receiving, at the one or more memory devices, a command for the first memory bank to exit the second mode and for the third memory bank to exit the third mode, wherein switching the first memory bank and switching the third memory bank is based at least in part on receiving the command.

16. The memory system of claim 10, wherein the bitmap comprises an identifier specific to the first memory bank.

17. The memory system of claim 10, wherein the bitmap comprises an identifier of a group of banks that includes the first memory bank.

18. The memory system of claim 10, wherein the single command comprises one or more identifiers corresponding to a range of bank addresses that includes a bank address for the first memory bank.

19. A non-transitory computer-readable medium storing code, the code comprising instructions executable by one or more processors to:

operate a plurality of memory banks in respective first modes, wherein the plurality of memory banks are within one or more memory devices;

receive, via a command bus and at the one or more memory devices while operating the plurality of memory banks in the respective first modes, receive a single command that comprises a bitmap that indicates to operate a first memory bank of the plurality in a second mode corresponding to a lower power consumption level than a respective first mode for the first memory bank, wherein each bit of the bitmap indicates a respective mode of one or more memory banks of the plurality of memory banks; and switch, based at least in part on receiving the bitmap, the first memory bank from the respective first mode for the first memory bank to the second mode while maintaining a second memory bank of the plurality in a respective first mode for the second memory bank.

20. The non-transitory computer-readable medium of claim 19, wherein:

the second mode is one of a plurality of low power modes supported by the one or more memory devices for the plurality of memory banks, each of the plurality of low power modes corresponding to a respective power consumption level that is lower than a power consumption level corresponding to an idle mode supported by the one or more memory devices for the plurality of memory banks; and the bitmap comprises an indication of a selected low power mode from the plurality of low power modes, the selected low power mode being the second mode.

* * * * *